United States Patent
Salvia et al.

(10) Patent No.: US 10,315,222 B2
(45) Date of Patent: Jun. 11, 2019

(54) TWO-DIMENSIONAL ARRAY OF CMOS CONTROL ELEMENTS

(71) Applicant: InvenSense, Inc., San Jose, CA (US)

(72) Inventors: James Christian Salvia, San Jose, CA (US); Michael H. Perrott, Nashua, NH (US); Marian Voros, Bratislava (SK); Eldwin Ng, Mountain View, CA (US); Julius Ming-Lin Tsai, San Jose, CA (US); Nikhil Apte, Palo Alto, CA (US)

(73) Assignee: InvenSense, Inc., San Jose, CA (US)

( * ) Notice: Subject to any disclaimer, the term of this patent is extended or adjusted under 35 U.S.C. 154(b) by 206 days.

(21) Appl. No.: 15/294,130

(22) Filed: Oct. 14, 2016

(65) Prior Publication Data
US 2017/0322291 A1 Nov. 9, 2017

Related U.S. Application Data

(63) Continuation-in-part of application No. 15/205,743, filed on Jul. 8, 2016.
(Continued)

(51) Int. Cl.
*B60B 1/00* (2006.01)
*B06B 1/06* (2006.01)
(Continued)

(52) U.S. Cl.
CPC ........ *B06B 1/0622* (2013.01); *G06F 3/03547* (2013.01); *G06K 9/001* (2013.01);
(Continued)

(58) Field of Classification Search
None
See application file for complete search history.

(56) References Cited

U.S. PATENT DOCUMENTS 5,575,286 A 11/1996 Weng et al.
5,684,243 A 11/1997 Gururaja et al.
(Continued)

FOREIGN PATENT DOCUMENTS

EP 1214909 A1 6/2002
EP 2884301 A1 6/2015
(Continued)

OTHER PUBLICATIONS

ISA/EP, International Search Report and Written Opinion for International Application No. PCT/US2017/031140, 18 pages, dated Nov. 2, 2017 (Nov. 2, 2017).
(Continued)

*Primary Examiner* — Hovhannes Baghdasaryan

(57) ABSTRACT

An electronic device includes a plurality of CMOS control elements arranged in a two-dimensional array, where each CMOS control element of the plurality of CMOS control elements includes two semiconductor devices. The plurality of CMOS control elements include a first subset of CMOS control elements, each CMOS control element of the first subset of CMOS control elements including a semiconductor device of a first class and a semiconductor device of a second class, and a second subset of CMOS control elements, each CMOS control element of the second subset of CMOS control elements including a semiconductor device of the first class and a semiconductor device of a third class. The plurality of CMOS control elements are arranged in the two-dimensional array such that CMOS semiconductor devices of the first class are only adjacent to other CMOS semiconductor devices of the first class, CMOS semiconductor devices of the second class are only adjacent to other CMOS semiconductor devices of the second class, and CMOS semiconductor devices of the third class are only
(Continued)

adjacent to other CMOS semiconductor devices of the third class.

25 Claims, 17 Drawing Sheets

Related U.S. Application Data

(60) Provisional application No. 62/334,394, filed on May 10, 2016, provisional application No. 62/331,919, filed on May 4, 2016.

(51) Int. Cl.
  *G06K 9/00* (2006.01)
  *G06F 3/0354* (2013.01)
  *H01L 27/092* (2006.01)

(52) U.S. Cl.
  CPC ......... *G06K 9/0002* (2013.01); *G06K 9/0008* (2013.01); *G06F 2203/0338* (2013.01); *H01L 27/0922* (2013.01)

(56) References Cited

U.S. PATENT DOCUMENTS

| | | | |
|---|---|---|---|
| 5,867,302 | A | 2/1999 | Fleming |
| 6,071,239 | A | 6/2000 | Cribbs et al. |
| 6,289,112 | B1 | 9/2001 | Jain et al. |
| 6,350,652 | B1* | 2/2002 | Libera ............... H01L 27/105 257/E21.689 |
| 6,428,477 | B1 | 8/2002 | Mason |
| 6,736,779 | B1 | 5/2004 | Sano et al. |
| 7,067,962 | B2 | 6/2006 | Scott |
| 7,109,642 | B2 | 9/2006 | Scott |
| 7,243,547 | B2 | 7/2007 | Cobianu et al. |
| 7,400,750 | B2 | 7/2008 | Nam |
| 7,459,836 | B2 | 12/2008 | Scott |
| 7,471,034 | B2 | 12/2008 | Schlote-Holubek et al. |
| 7,489,066 | B2 | 2/2009 | Scott et al. |
| 7,739,912 | B2 | 6/2010 | Schneider et al. |
| 8,018,010 | B2 | 9/2011 | Tigli et al. |
| 8,139,827 | B2 | 3/2012 | Schneider et al. |
| 8,335,356 | B2 | 12/2012 | Schmitt |
| 8,433,110 | B2 | 4/2013 | Kropp et al. |
| 8,508,103 | B2 | 8/2013 | Schmitt et al. |
| 8,515,135 | B2 | 8/2013 | Clarke et al. |
| 8,666,126 | B2 | 3/2014 | Lee et al. |
| 8,703,040 | B2 | 4/2014 | Liufu et al. |
| 8,723,399 | B2 | 5/2014 | Sammoura et al. |
| 8,805,031 | B2 | 8/2014 | Schmitt |
| 9,056,082 | B2 | 6/2015 | Liautaud et al. |
| 9,572,549 | B2 | 2/2017 | Belevich et al. |
| 9,582,102 | B2 | 2/2017 | Setlak |
| 9,607,203 | B1 | 3/2017 | Yazdandoost et al. |
| 2002/0135273 | A1 | 9/2002 | Mauchamp et al. |
| 2004/0085858 | A1 | 5/2004 | Khuri-Yakub et al. |
| 2004/0122316 | A1 | 6/2004 | Satoh et al. |
| 2004/0174773 | A1 | 9/2004 | Thomenius et al. |
| 2005/0057284 | A1 | 3/2005 | Wodnicki |
| 2005/0110071 | A1 | 5/2005 | Ema et al. |
| 2005/0146240 | A1 | 7/2005 | Smith et al. |
| 2005/0148132 | A1 | 7/2005 | Wodnicki et al. |
| 2005/0162040 | A1 | 7/2005 | Robert |
| 2006/0079777 | A1 | 4/2006 | Karasawa |
| 2007/0046396 | A1 | 3/2007 | Huang |
| 2007/0073135 | A1 | 3/2007 | Lee et al. |
| 2007/0202252 | A1 | 8/2007 | Sasaki |
| 2007/0215964 | A1 | 9/2007 | Khuri-Yakub et al. |
| 2007/0230754 | A1 | 10/2007 | Jain et al. |
| 2008/0125660 | A1 | 5/2008 | Yao et al. |
| 2008/0150032 | A1* | 6/2008 | Tanaka ............... H01L 27/0928 257/368 |
| 2008/0194053 | A1 | 8/2008 | Huang |
| 2009/0182237 | A1 | 7/2009 | Angelsen et al. |
| 2009/0274343 | A1 | 11/2009 | Clarke |
| 2010/0030076 | A1 | 2/2010 | Vortman et al. |
| 2010/0168583 | A1 | 7/2010 | Dausch et al. |
| 2010/0195851 | A1 | 8/2010 | Buccafusca |
| 2010/0201222 | A1 | 8/2010 | Adachi et al. |
| 2010/0202254 | A1 | 8/2010 | Roest et al. |
| 2010/0239751 | A1 | 9/2010 | Regniere |
| 2010/0251824 | A1 | 10/2010 | Schneider et al. |
| 2010/0256498 | A1 | 10/2010 | Tanaka |
| 2011/0285244 | A1 | 11/2011 | Lewis et al. |
| 2011/0291207 | A1 | 12/2011 | Martin et al. |
| 2012/0016604 | A1 | 1/2012 | Irving et al. |
| 2012/0092026 | A1 | 4/2012 | Liautaud et al. |
| 2012/0095347 | A1 | 4/2012 | Adam et al. |
| 2012/0147698 | A1 | 6/2012 | Wong et al. |
| 2012/0232396 | A1 | 9/2012 | Tanabe |
| 2012/0238876 | A1 | 9/2012 | Tanabe et al. |
| 2012/0279865 | A1 | 11/2012 | Regniere et al. |
| 2012/0288641 | A1 | 11/2012 | Diatezua et al. |
| 2013/0051179 | A1 | 2/2013 | Hong |
| 2013/0064043 | A1 | 3/2013 | Degertekin et al. |
| 2013/0127592 | A1 | 5/2013 | Fyke et al. |
| 2013/0133428 | A1 | 5/2013 | Lee et al. |
| 2013/0201134 | A1 | 8/2013 | Schneider et al. |
| 2013/0294202 | A1 | 11/2013 | Hajati |
| 2014/0060196 | A1 | 3/2014 | Falter et al. |
| 2014/0117812 | A1 | 5/2014 | Hajati |
| 2014/0176332 | A1 | 6/2014 | Alameh et al. |
| 2014/0208853 | A1 | 7/2014 | Onishi et al. |
| 2014/0219521 | A1 | 8/2014 | Schmitt et al. |
| 2014/0232241 | A1 | 8/2014 | Hajati |
| 2014/0265721 | A1 | 9/2014 | Robinson et al. |
| 2014/0355387 | A1 | 12/2014 | Kitchens et al. |
| 2015/0036065 | A1 | 2/2015 | Yousefpor et al. |
| 2015/0087991 | A1 | 3/2015 | Chen et al. |
| 2015/0097468 | A1 | 4/2015 | Hajati et al. |
| 2015/0145374 | A1 | 5/2015 | Xu et al. |
| 2015/0164473 | A1 | 6/2015 | Kim et al. |
| 2015/0165479 | A1 | 6/2015 | Lasiter et al. |
| 2015/0169136 | A1 | 6/2015 | Ganti et al. |
| 2015/0189136 | A1 | 7/2015 | Chung et al. |
| 2015/0198699 | A1 | 7/2015 | Kuo et al. |
| 2015/0206738 | A1 | 7/2015 | Rastegar |
| 2015/0213180 | A1 | 7/2015 | Herberholz |
| 2015/0220767 | A1 | 8/2015 | Yoon et al. |
| 2015/0261261 | A1 | 9/2015 | Bhagavatula et al. |
| 2015/0286312 | A1 | 10/2015 | Kang et al. |
| 2015/0345987 | A1 | 12/2015 | Hajati |
| 2016/0051225 | A1 | 2/2016 | Kim et al. |
| 2016/0063294 | A1 | 3/2016 | Du et al. |
| 2016/0086010 | A1 | 3/2016 | Merrell et al. |
| 2016/0092716 | A1 | 3/2016 | Yazdandoost et al. |
| 2016/0100822 | A1 | 4/2016 | Kim et al. |
| 2016/0107194 | A1 | 4/2016 | Panchawagh et al. |
| 2017/0330552 | A1 | 1/2017 | Garlepp et al. |
| 2017/0075700 | A1 | 3/2017 | Abudi et al. |
| 2017/0110504 | A1* | 4/2017 | Panchawagh |
| 2017/0219536 | A1 | 8/2017 | Koch et al. |
| 2017/0231534 | A1 | 8/2017 | Agassy et al. |
| 2017/0293791 | A1 | 10/2017 | Mainguet et al. |
| 2017/0322290 | A1 | 11/2017 | Ng |
| 2017/0322292 | A1 | 11/2017 | Salvia et al. |
| 2017/0322305 | A1 | 11/2017 | Apte et al. |
| 2017/0323133 | A1 | 11/2017 | Tsai |
| 2017/0326590 | A1 | 11/2017 | Daneman |
| 2017/0326591 | A1 | 11/2017 | Apte et al. |
| 2017/0326593 | A1 | 11/2017 | Garlepp et al. |
| 2017/0326594 | A1 | 11/2017 | Berger et al. |
| 2017/0328866 | A1 | 11/2017 | Apte et al. |
| 2017/0328870 | A1 | 11/2017 | Garlepp et al. |
| 2017/0330012 | A1 | 11/2017 | Salvia et al. |
| 2017/0330553 | A1 | 11/2017 | Garlepp et al. |
| 2018/0206820 | A1 | 7/2018 | Anand et al. |

FOREIGN PATENT DOCUMENTS

| | | |
|---|---|---|
| JP | 2011040467 A | 2/2011 |
| WO | 2009096576 A2 | 8/2009 |
| WO | 2009137106 A2 | 11/2009 |

(56) References Cited

FOREIGN PATENT DOCUMENTS

| | | |
|---|---|---|
| WO | 2014035564 A1 | 3/2014 |
| WO | 2015009635 A1 | 1/2015 |
| WO | 2015112453 A1 | 7/2015 |
| WO | 2015120132 A1 | 8/2015 |
| WO | 2015131083 A1 | 9/2015 |
| WO | 2015183945 A1 | 12/2015 |
| WO | 2016007250 A1 | 1/2016 |
| WO | 2016011172 A1 | 1/2016 |
| WO | 2016040333 A2 | 3/2016 |
| WO | 2017003848 A1 | 1/2017 |
| WO | 2017192895 A1 | 11/2017 |
| WO | 2017196678 A1 | 11/2017 |
| WO | 2017196682 A1 | 11/2017 |
| WO | 2017192903 A3 | 12/2017 |

OTHER PUBLICATIONS

ISA/EP, International Search Report for International Application No. PCT/US2017/031826, 16 pages, dated Feb. 27, 2018 (Feb. 27, 2018).

ISA/EP, Partial International Search Report for International Application No. PCT/US2017/031823, 12 pages, dated Nov. 30, 2017 (Nov. 30, 2017).

Tang, et al., "Pulse-Echo Ultrasonic Fingerprint Sensor on a Chip", IEEE Transducers, Anchorage, Alaska, USA, Jun. 21-25, 2015, pp. 674-677.

Dausch, et al., "Theory and Operation of 2-D Array Piezoelectric Micromachined Ultrasound Transducers", IEEE Transactions on Ultrasonics, and Frequency Control, vol. 55, No. 11;, Nov. 2008, 2484-2492.

Hopcroft, et al., "Temperature Compensation of a MEMS Resonator Using Quality Factor as a Thermometer", Retrieved from Internet: http://micromachine.stanford.edu/~amanu/linked/MAH_MEMS2006.pdf, 2006, 222-225.

Hopcroft, et al., "Using the temperature dependence of resonator quality factor as a thermometer", Applied Physics Letters 91. Retrieved from Internet: http://micromachine.stanford.edu/~hopcroft/Publications/Hoperoft_QT_ApplPhysLett_91_013505.pdf, 2007, 013505-1-031505-3.

Lee, et al., "Low jitter and temperature stable MEMS oscillators", Frequency Control Symposium (FCS), 2012 IEEE International, May 2012, 1-5.

Li, et al., "Capacitive micromachined ultrasonic transducer for ultra-low pressure measurement: Theoretical study", AIP Advances 5.12. Retrieved from Internet: http://scitation.aip.org/content/aip/journal/adva/5/12/10.1063/1.4939217, 2015, 127231.

Qiu, et al., "Piezoelectric Micromachined Ultrasound Transducer (PMUT) Arrays for Integrated Sensing, Actuation and Imaging", Sensors 15, doi:10.3390/s150408020, Apr. 3, 2015, 8020-8041.

Savoia, et al., "Design and Fabrication of a cMUT Probe for Ultrasound Imaging of Fingerprints", 2010 IEEE International Ultrasonics Symposium Proceedings, Oct. 2010, 1877-1880.

Shen, et al., "Anisotropic Complementary Acoustic Metamaterial for Canceling out Aberrating Layers", American Physical Society, Physical Review X 4.4: 041033., Nov. 19, 2014, 041033-1-041033-7.

Thakar, et al., "Multi-resonator approach to eliminating the temperature dependence of silicon-based timing references", Hilton Head'14. Retrieved from the Internet: http://blog.narotama.ac.id/wp-content/uploads/2014/12/Multi-resonator-approach-to-eliminating-the-temperature-dependance-of-silicon-based-timing-references.pdf, 2014, 415-418.

ISA/EP, International Search Report and Written Opinion for International Application No. PCT/US2017/031120, 12 pages, dated Aug. 29, 2017 (Aug. 29, 2017).

ISA/EP, International Search Report and Written Opinion for International Application No. PCT/US2017/031120, 13 pages, dated Sep. 1, 2017 (Sep. 1, 2017).

ISA/EP, International Search Report and Written Opinion for International Application No. PCT/US2017/031134, 12 pages, dated Aug. 30, 2017 (Aug. 30, 2017).

ISA/EP, International Search Report and Written Opinion for International Application No. PCT/US2017/031421 13 pages, dated Jun. 21, 2017 (Jun. 21, 2017).

ISA/EP, International Search Report and Written Opinion for International Application No. PCT/US2017/031426 13 pages, dated Jun. 22, 2017 (Jun. 22, 2017).

ISA/EP, International Search Report and Written Opinion for International Application No. PCT/US2017/031431, 14 pages, dated Aug. 1, 2017 (Aug. 1, 2017).

ISA/EP, International Search Report and Written Opinion for International Application No. PCT/US2017/031434, 13 pages, Jun. 26, 2017 (Jun. 26, 2017).

ISA/EP, International Search Report and Written Opinion for International Application No. PCT/US2017/031439, 10 pages, dated Jun. 20, 2017 (Jun. 20, 2017).

ISA/EP, International Search Report and Written Opinion for International Application No. PCT/US2017/031824, 18 pages, dated Sep. 22, 2017 (Sep. 22, 2017).

Isa/Ep, International Search Report and Written Opinion for International Application No. PCT/US2017/031827, 16 pp., 1 Aug. 2017 (Jan. 08, 2017).

ISA/EP, International Search Report and Written Opinion for International Application No. PCT/US2017/031831, 12 pages, dated Jul. 21, 2017 (Jul. 21, 2017).

ISA/EP, Partial International Search Report for International Application No. PCT/US2017/031140, 13 pages, Aug. 29, 2017 (Aug. 29, 2017).

Rozen, et al., "Air-Coupled Aluminum Nitride Piezoelectric Micromachined Ultrasonic Transducers at 0.3 Mhz to 0.9 Mhz", 2015 28th IEEE International Conference on Micro Electro Mechanical Systems (MEMS), IEEE, Jan. 18, 2015, 921-924.

"ISA/EP, International Search Report and Written Opinion for International Application # PCT/US2018/063431, pp. 1-15, dated Feb. 5, 2019 (Feb. 5, 2019))".

"Moving Average Filters", Waybackmachine XP05547422, Retrieved from the Internet: URL:https://web.archive.org/web/20170809081353/https//www.analog.com/media/en/technical-documentation/dsp-book/dsp_book_Ch15.pdf [retrieved on Jan. 24, 2019], Aug. 9, 2017, 1-8.

"Receiver Thermal Noise Threshold", Fisher Telecommunication Services, Satellite Communication. Retrieved from the Internet: URL:https://web.archive.org/web/20171027075705/http//www.fishercom.xyz:80/satellite-communications/receiver-thermal-noise-threshold.html, Oct. 27, 2017, 3.

"Sleep Mode", Wikipedia, Retrieved from the Internet: URL:https://web.archive.org/web/20170908153323/https://en.wikipedia.org/wiki/Sleep_mode [retrieved on Jan. 25, 2019], Sep. 8, 2017, 1-3.

"TMS320C5515 Fingerprint Development Kit (FDK) Hardware Guide", Texas Instruments, Literature Number: SPRUFX3, XP055547651, Apr. 2010, 1-26.

"ZTE V7 MAX. 5,5" smartphone on MediaTeck Helio P10 cpu; Published on Apr. 20, 2016; https://www.youtube.com/watch?v=ncNCbpkGQzU (Year: 2016).

* cited by examiner

TWO-DIMENSIONAL ARRAY OF CMOS CONTROL ELEMENTS

RELATED APPLICATIONS

This application claims priority to, is a continuation-in-part of, and claims the benefit of co-pending U.S. non-provisional patent application Ser. No. 15/205,743, filed on Jul. 8, 2016, entitled "A PIEZOELECTRIC MICROMACHINED ULTRASONIC TRANSDUCER (PMUT)," by Ng et al., and assigned to the assignee of the present application, which is herein incorporated by reference in its entirety.

U.S. non-provisional patent application Ser. No. 15/205,743 claims priority to U.S. Provisional Patent Application 62/331,919, filed on May 4, 2016, entitled "PINNED ULTRASONIC TRANSDUCERS," by Ng et al., and assigned to the assignee of the present application, and incorporated U.S. Provisional Patent Application 62/331,919 by reference in its entirety.

The present application also claims priority to U.S. Provisional Patent Application 62/331,919, filed on May 4, 2016, entitled "PINNED ULTRASONIC TRANSDUCERS," by Ng et al., and assigned to the assignee of the present application, which is incorporated herein by reference in its entirety.

The present application also claims priority to and the benefit of U.S. Provisional Patent Application 62/334,394, filed on May 10, 2016, entitled "MIXED SIGNAL CMOS FOR MEMS ARRAY," by Salvia, and assigned to the assignee of the present application, which is incorporated herein by reference in its entirety.

BACKGROUND

Microelectromechanical systems (MEMS) devices may be integrated with Complementary Metal Oxide Semiconductor (CMOS) electronics for control. For instance, arrays of MEMS devices may overlay a corresponding array of CMOS control elements.

BRIEF DESCRIPTION OF THE DRAWINGS

The accompanying drawings, which are incorporated in and form a part of the Description of Embodiments, illustrate various embodiments of the subject matter and, together with the Description of Embodiments, serve to explain principles of the subject matter discussed below. Unless specifically noted, the drawings referred to in this Brief Description of Drawings should be understood as not being drawn to scale. Herein, like items are labeled with like item numbers.

DESCRIPTION OF EMBODIMENTS

Figure 1:
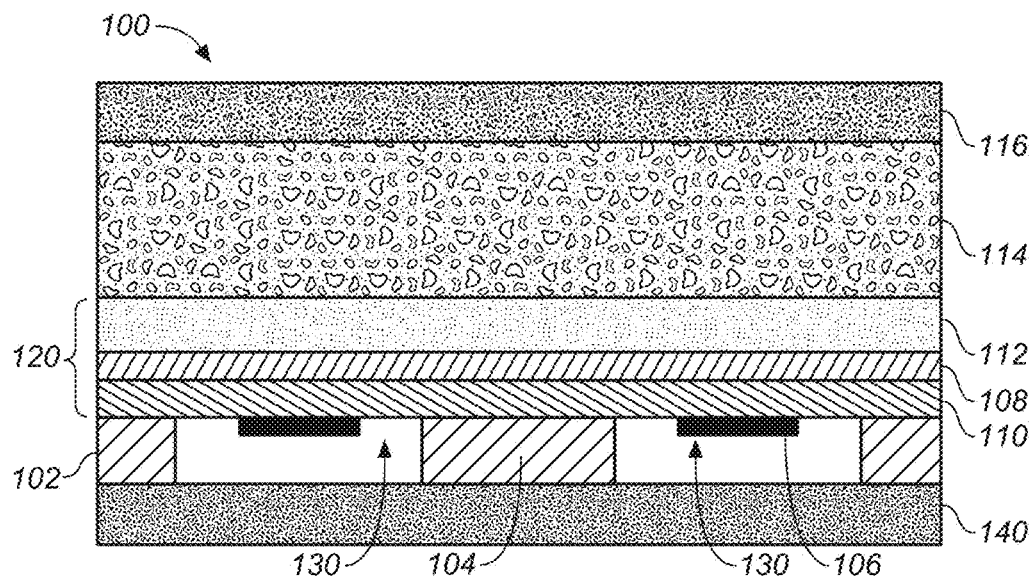
FIG. 1 is a diagram illustrating a PMUT device having a center pinned membrane, according to some embodiments.

The following Description of Embodiments is merely provided by way of example and not of limitation. Furthermore, there is no intention to be bound by any expressed or implied theory presented in the preceding background or in the following Description of Embodiments.

Reference will now be made in detail to various embodiments of the subject matter, examples of which are illustrated in the accompanying drawings. While various embodiments are discussed herein, it will be understood that they are not intended to limit to these embodiments. On the contrary, the presented embodiments are intended to cover alternatives, modifications and equivalents, which may be included within the spirit and scope the various embodiments as defined by the appended claims. Furthermore, in this Description of Embodiments, numerous specific details are set forth in order to provide a thorough understanding of embodiments of the present subject matter. However, embodiments may be practiced without these specific details. In other instances, well known methods, procedures, components, and circuits have not been described in detail as not to unnecessarily obscure aspects of the described embodiments.

Notation and Nomenclature

Some portions of the detailed descriptions which follow are presented in terms of procedures, logic blocks, processing and other symbolic representations of operations on data within an electrical device. These descriptions and representations are the means used by those skilled in the data processing arts to most effectively convey the substance of their work to others skilled in the art. In the present application, a procedure, logic block, process, or the like, is conceived to be one or more self-consistent procedures or instructions leading to a desired result. The procedures are those requiring physical manipulations of physical quantities. Usually, although not necessarily, these quantities take the form of acoustic (e.g., ultrasonic) signals capable of being transmitted and received by an electronic device and/or electrical or magnetic signals capable of being stored, transferred, combined, compared, and otherwise manipulated in an electrical device.

It should be borne in mind, however, that all of these and similar terms are to be associated with the appropriate physical quantities and are merely convenient labels applied to these quantities. Unless specifically stated otherwise as apparent from the following discussions, it is appreciated that throughout the description of embodiments, discussions utilizing terms such as "transmitting," "receiving," "sensing," "generating," "imaging," or the like, refer to the actions and processes of an electronic device such as an electrical device.

Embodiments described herein may be discussed in the general context of processor-executable instructions residing on some form of non-transitory processor-readable medium, such as program modules, executed by one or more computers or other devices. Generally, program modules include routines, programs, objects, components, data structures, etc., that perform particular tasks or implement particular abstract data types. The functionality of the program modules may be combined or distributed as desired in various embodiments.

In the figures, a single block may be described as performing a function or functions; however, in actual practice, the function or functions performed by that block may be performed in a single component or across multiple components, and/or may be performed using hardware, using software, or using a combination of hardware and software. To clearly illustrate this interchangeability of hardware and software, various illustrative components, blocks, modules, logic, circuits, and steps have been described generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure. Also, the example fingerprint sensing system and/or mobile electronic device described herein may include components other than those shown, including well-known components.

Various techniques described herein may be implemented in hardware, software, firmware, or any combination thereof, unless specifically described as being implemented in a specific manner. Any features described as modules or components may also be implemented together in an integrated logic device or separately as discrete but interoperable logic devices. If implemented in software, the techniques may be realized at least in part by a non-transitory processor-readable storage medium comprising instructions that, when executed, perform one or more of the methods described herein. The non-transitory processor-readable data storage medium may form part of a computer program product, which may include packaging materials.

The non-transitory processor-readable storage medium may comprise random access memory (RAM) such as synchronous dynamic random access memory (SDRAM), read only memory (ROM), non-volatile random access memory (NVRAM), electrically erasable programmable read-only memory (EEPROM), FLASH memory, other known storage media, and the like. The techniques additionally, or alternatively, may be realized at least in part by a processor-readable communication medium that carries or communicates code in the form of instructions or data structures and that can be accessed, read, and/or executed by a computer or other processor.

Various embodiments described herein may be executed by one or more processors, such as one or more motion processing units (MPUs), sensor processing units (SPUs), host processor(s) or core(s) thereof, digital signal processors (DSPs), general purpose microprocessors, application specific integrated circuits (ASICs), application specific instruction set processors (ASIPs), field programmable gate arrays (FPGAs), a programmable logic controller (PLC), a complex programmable logic device (CPLD), a discrete gate or transistor logic, discrete hardware components, or any combination thereof designed to perform the functions described herein, or other equivalent integrated or discrete logic circuitry. The term "processor," as used herein may refer to any of the foregoing structures or any other structure suitable for implementation of the techniques described herein. As it employed in the subject specification, the term "processor" can refer to substantially any computing processing unit or device comprising, but not limited to comprising, single-core processors; single-processors with software multithread execution capability; multi-core processors; multi-core processors with software multithread execution capability; multi-core processors with hardware multithread technology; parallel platforms; and parallel platforms with distributed shared memory. Moreover, processors can exploit nano-scale architectures such as, but not limited to, molecular and quantum-dot based transistors, switches and gates, in order to optimize space usage or enhance performance of user equipment. A processor may also be implemented as a combination of computing processing units.

In addition, in some aspects, the functionality described herein may be provided within dedicated software modules or hardware modules configured as described herein. Also, the techniques could be fully implemented in one or more circuits or logic elements. A general purpose processor may be a microprocessor, but in the alternative, the processor may be any conventional processor, controller, microcontroller, or state machine. A processor may also be implemented as a combination of computing devices, e.g., a combination of an SPU/MPU and a microprocessor, a plurality of microprocessors, one or more microprocessors in conjunction with an SPU core, MPU core, or any other such configuration.

Overview of Discussion

Discussion begins with a description of an example piezoelectric micromachined ultrasonic transducer (PMUT), in accordance with various embodiments. Example arrays including PMUT devices are then described. Example arrangements of CMOS control elements are then described.

Embodiments described herein relate to a two-dimensional array of CMOS control elements. A MEMS device utilizes control electronics, such as a CMOS control element, to control the operation of the MEMS device. Where the MEMS devices are arranged in a two-dimensional array, a corresponding two-dimensional array of CMOS control elements may also be used to control the operation of the two-dimensional array of MEMS devices. For example, CMOS control elements may include multiple classes of semiconductor devices, such as low voltage (LV) devices (e.g., LV NMOS and LV PMOS devices), high voltage (HV) NMOS, and HV PMOS devices. However, manufacturing and design rules may dictate particular separation distances (e.g., spacing rules) between different classes of CMOS semiconductor devices. It should be appreciated that the spacing rules may require separation distances between particular portions of the CMOS control elements. For example, in some embodiments, the separation distance is between 1) a drain of an HV NMOS device and a P-type diffusion in an N-type well of an adjacent CMOS control element, and 2) a drain of an HV PMOS device and an N-type diffusion in a P-type substrate or well of an adjacent CMOS control element. For example, in some manufacturing scenarios, HV NMOS devices and HV PMOS device must be separated by at least 40 microns (micrometer) to ensure proper manufacturing and performance.

The spacing rules are of particular importance as MEMS device applications use smaller and more compactly positioned arrays of MEMS devices. For example, a fingerprint sensor utilizing ultrasonic transducers may require, for better performance, that the ultrasonic transducers be arranged within a two-dimensional array that does not allow for a one-to-one correspondence between the ultrasonic transducers and the corresponding CMOS control element, as the required semiconductor devices might not fit within the area of the CMOS control element. Embodiments described herein provide arrangements of CMOS control elements within two-dimensional arrays that account for the spacing rules imposed by the manufacturing process, while allowing for the compact layout of the corresponding MEMS devices (e.g., ultrasonic transducers). It should be appreciated that in accordance with various embodiments, LV devices (e.g., LV NMOS and LV PMOS devices) are collectively described herein, as their spacing requirements are typically much less than those of HV devices (e.g., about 1 micron), and thus do not impact the manufacturing rules and specifications. As such, LV devices within a CMOS control element, in accordance with various embodiments, may include multiple types or classes of LV devices, and are collectively described herein for simplicity.

In one embodiment, an electronic device includes a plurality of CMOS control elements arranged in a two-dimensional array, where each CMOS control element of the plurality of CMOS control elements includes two semiconductor devices. The plurality of CMOS control elements include a first subset of CMOS control elements, each CMOS control element of the first subset of CMOS control elements including a semiconductor device of a first class and a semiconductor device of a second class, and a second subset of CMOS control elements, each CMOS control element of the second subset of CMOS control elements including a semiconductor device of the first class and a semiconductor device of a third class. The plurality of CMOS control elements are arranged in the two-dimensional array such that CMOS semiconductor devices of the first class are only adjacent to other CMOS semiconductor devices of the first class, CMOS semiconductor devices of the second class are only adjacent to other CMOS semiconductor devices of the second class, and CMOS semiconductor devices of the third class are only adjacent to other CMOS semiconductor devices of the third class.

In another embodiment, an electronic device includes a plurality of CMOS control elements arranged in a two-dimensional array, where each CMOS control element of the plurality of CMOS control elements includes three semiconductor devices. In the present embodiment, each of the three semiconductor devices is disposed in a different corner of the CMOS control element and separated by a spacing width, where the semiconductor devices include a semiconductor device of a first class, a semiconductor device of a second class, and a semiconductor device of a third class. The plurality of CMOS control elements are arranged in the two-dimensional array such that CMOS semiconductor devices of the first class are only adjacent to other CMOS semiconductor devices of the first class, CMOS semiconductor devices of the second class are only adjacent to other CMOS semiconductor devices of the second class, and CMOS semiconductor devices of the third class are only adjacent to other CMOS semiconductor devices of the third class.

In another embodiment, an electronic device includes a plurality of CMOS control elements arranged in a two-dimensional array, each CMOS control element of the plurality of CMOS control elements including a semiconductor device. The plurality of CMOS control elements includes a first subset of CMOS control elements comprising a semiconductor device of a first class, a second subset of CMOS control elements comprising a semiconductor device of a second class, and a third subset of CMOS control elements comprising a semiconductor device of a third class. The plurality of CMOS control elements are arranged in the two-dimensional array such that CMOS semiconductor devices of the first class are only adjacent to other CMOS semiconductor devices of the first class, CMOS semiconductor devices of the second class are only adjacent to other CMOS semiconductor devices of the second class, and CMOS semiconductor devices of the third class are only adjacent to other CMOS semiconductor devices of the third class.

In another embodiment, an electronic device includes a plurality of CMOS control elements arranged in a two-dimensional array, each CMOS control element including semiconductor devices. The plurality of CMOS control elements each include a PMOS semiconductor device portion including a high voltage PMOS device and a low voltage PMOS device and an NMOS semiconductor device portion including a high voltage NMOS device and a low voltage NMOS device. The plurality of CMOS control elements are arranged in the two-dimensional array such that the PMOS semiconductor device portion of a CMOS control element of the plurality of CMOS control elements is only adjacent to other PMOS semiconductor device portions of adjacent CMOS control elements of the plurality of CMOS control elements, and such that the NMOS semiconductor device portion of a CMOS control element of the plurality of CMOS control elements is only adjacent to other NMOS semiconductor device portions of adjacent CMOS control elements of the plurality of CMOS control elements.

In another embodiment, an electronic device includes a plurality of CMOS control elements arranged in a two-dimensional array, each CMOS control element including semiconductor devices. The plurality of CMOS control includes a first subset of CMOS control elements including a PMOS semiconductor device portion, the PMOS semiconductor device portion including a high voltage PMOS device and a low voltage PMOS device, and a second subset of CMOS control elements including an NMOS semiconductor device portion, the NMOS semiconductor device portion including a high voltage NMOS device and a low voltage NMOS device. The plurality of CMOS control elements are arranged in the two-dimensional array such that the PMOS semiconductor device portion of a CMOS control element of the first subset of CMOS control elements is only adjacent to other PMOS semiconductor device portions of adjacent CMOS control elements of the first subset of CMOS control elements, and such that the NMOS semiconductor device portion of a CMOS control element of the second subset of CMOS control elements is only adjacent to other NMOS semiconductor device portions of adjacent CMOS control elements of the second subset of CMOS control elements.

Piezoelectric Micromachined Ultrasonic Transducer (PMUT)

Systems and methods disclosed herein, in one or more aspects provide efficient structures for an acoustic transducer (e.g., a piezoelectric actuated transducer or PMUT). One or more embodiments are now described with reference to the drawings, wherein like reference numerals are used to refer to like elements throughout. In the following description, for purposes of explanation, numerous specific details are set forth in order to provide a thorough understanding of the various embodiments. It may be evident, however, that the various embodiments can be practiced without these specific details. In other instances, well-known structures and devices are shown in block diagram form in order to facilitate describing the embodiments in additional detail.

As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form. In addition, the word "coupled" is used herein to mean direct or indirect electrical or mechanical coupling. In addition, the word "example" is used herein to mean serving as an example, instance, or illustration.

FIG. 1 is a diagram illustrating a PMUT device 100 having a center pinned membrane, according to some embodiments. PMUT device 100 includes an interior pinned membrane 120 positioned over a substrate 140 to define a cavity 130. In one embodiment, membrane 120 is attached both to a surrounding edge support 102 and interior support 104. In one embodiment, edge support 102 is connected to an electric potential. Edge support 102 and interior support 104 may be made of electrically conducting materials, such as and without limitation, aluminum, molybdenum, or titanium. Edge support 102 and interior support 104 may also be made of dielectric materials, such as silicon dioxide, silicon nitride or aluminum oxide that have electrical connections the sides or in vias through edge support 102 or interior support 104, electrically coupling lower electrode 106 to electrical wiring in substrate 140.

In one embodiment, both edge support 102 and interior support 104 are attached to a substrate 140. In various embodiments, substrate 140 may include at least one of, and without limitation, silicon or silicon nitride. It should be appreciated that substrate 140 may include electrical wirings and connection, such as aluminum or copper. In one embodiment, substrate 140 includes a CMOS logic wafer bonded to edge support 102 and interior support 104. In one embodiment, the membrane 120 comprises multiple layers. In an example embodiment, the membrane 120 includes lower electrode 106, piezoelectric layer 110, and upper electrode 108, where lower electrode 106 and upper electrode 108 are coupled to opposing sides of piezoelectric layer 110. As shown, lower electrode 106 is coupled to a lower surface of piezoelectric layer 110 and upper electrode 108 is coupled to an upper surface of piezoelectric layer 110. It should be appreciated that, in various embodiments, PMUT device 100 is a microelectromechanical (MEMS) device.

In one embodiment, membrane 120 also includes a mechanical support layer 112 (e.g., stiffening layer) to mechanically stiffen the layers. In various embodiments, mechanical support layer 112 may include at least one of, and without limitation, silicon, silicon oxide, silicon nitride, aluminum, molybdenum, titanium, etc. In one embodiment, PMUT device 100 also includes an acoustic coupling layer 114 above membrane 120 for supporting transmission of acoustic signals. It should be appreciated that acoustic coupling layer can include air, liquid, gel-like materials, or other materials for supporting transmission of acoustic signals. In one embodiment, PMUT device 100 also includes platen layer 116 above acoustic coupling layer 114 for containing acoustic coupling layer 114 and providing a contact surface for a finger or other sensed object with PMUT device 100. It should be appreciated that, in various embodiments, acoustic coupling layer 114 provides a contact surface, such that platen layer 116 is optional. Moreover, it should be appreciated that acoustic coupling layer 114 and/or platen layer 116 may be included with or used in conjunction with multiple PMUT devices. For example, an array of PMUT devices may be coupled with a single acoustic coupling layer 114 and/or platen layer 116.

Figure 2:
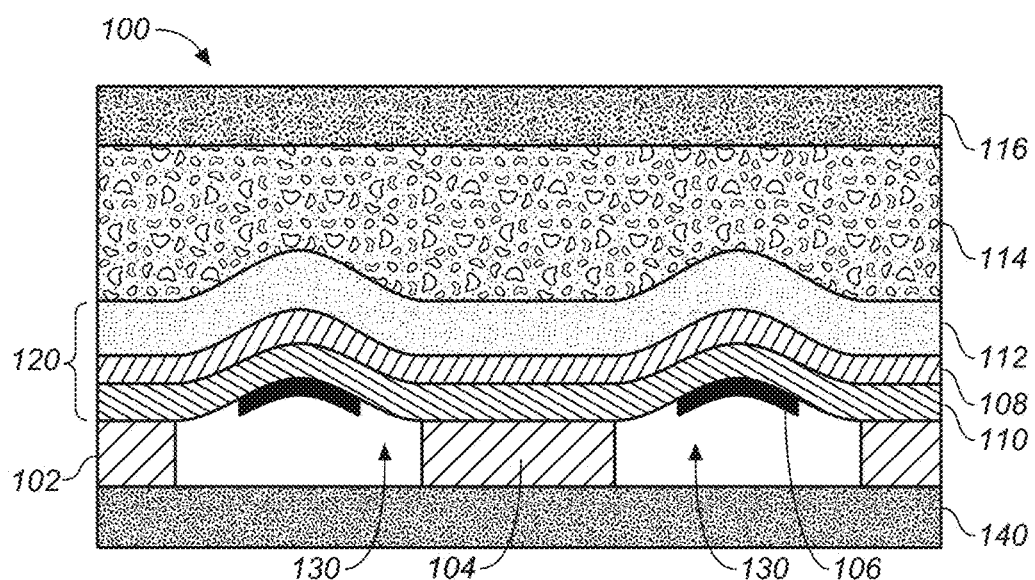
FIG. 2 is a diagram illustrating an example of membrane movement during activation of a PMUT device, according to some embodiments.

FIG. 2 is a diagram illustrating an example of membrane movement during activation of PMUT device 100, according to some embodiments. As illustrated with respect to FIG. 2, in operation, responsive to an object proximate platen layer 116, the electrodes 106 and 108 deliver a high frequency electric charge to the piezoelectric layer 110, causing those portions of the membrane 120 not pinned to the surrounding edge support 102 or interior support 104 to be displaced upward into the acoustic coupling layer 114. This generates a pressure wave that can be used for signal probing of the object. Return echoes can be detected as pressure waves causing movement of the membrane, with compression of the piezoelectric material in the membrane causing an electrical signal proportional to amplitude of the pressure wave.

The described PMUT device 100 can be used with almost any electrical device that converts a pressure wave into mechanical vibrations and/or electrical signals. In one aspect, the PMUT device 100 can comprise an acoustic sensing element (e.g., a piezoelectric element) that generates and senses ultrasonic sound waves. An object in a path of the generated sound waves can create a disturbance (e.g., changes in frequency or phase, reflection signal, echoes, etc.) that can then be sensed. The interference can be analyzed to determine physical parameters such as (but not limited to) distance, density and/or speed of the object. As an example, the PMUT device 100 can be utilized in various applications, such as, but not limited to, fingerprint or physiologic sensors suitable for wireless devices, industrial systems, automotive systems, robotics, telecommunications, security, medical devices, etc. For example, the PMUT device 100 can be part of a sensor array comprising a plurality of ultrasonic transducers deposited on a wafer, along with various logic, control and communication electronics. A sensor array may comprise homogenous or identical PMUT devices 100, or a number of different or heterogonous device structures.

In various embodiments, the PMUT device 100 employs a piezoelectric layer 110, comprised of materials such as, but not limited to, Aluminum nitride (AlN), lead zirconate titanate (PZT), quartz, polyvinylidene fluoride (PVDF), and/or zinc oxide, to facilitate both acoustic signal production and sensing. The piezoelectric layer 110 can generate electric charges under mechanical stress and conversely experience a mechanical strain in the presence of an electric field. For example, the piezoelectric layer 110 can sense mechanical vibrations caused by an ultrasonic signal and produce an electrical charge at the frequency (e.g., ultrasonic frequency) of the vibrations. Additionally, the piezoelectric layer 110 can generate an ultrasonic wave by vibrating in an oscillatory fashion that might be at the same frequency (e.g., ultrasonic frequency) as an input current generated by an alternating current (AC) voltage applied across the piezoelectric layer 110. It should be appreciated that the piezoelectric layer 110 can include almost any material (or combination of materials) that exhibits piezoelectric properties, such that the structure of the material does not have a center of symmetry and a tensile or compressive stress applied to the material alters the separation between positive and negative charge sites in a cell causing a polarization at the surface of the material. The polarization is directly proportional to the applied stress and is direction dependent so that compressive and tensile stresses results in electric fields of opposite polarizations.

Figure 10:
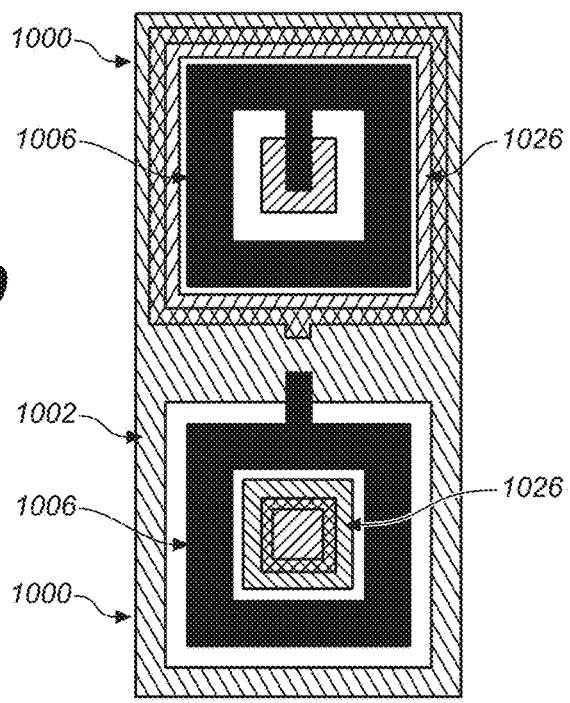
FIG. 10 illustrates an example pair of PMUT devices in a PMUT array, with each PMUT having differing electrode patterning, according to some embodiments.

Further, the PMUT device 100 comprises electrodes 106 and 108 that supply and/or collect the electrical charge to/from the piezoelectric layer 110. It should be appreciated that electrodes 106 and 108 can be continuous and/or patterned electrodes (e.g., in a continuous layer and/or a patterned layer). For example, as illustrated, electrode 106 is a patterned electrode and electrode 108 is a continuous electrode. As an example, electrodes 106 and 108 can be comprised of almost any metal layers, such as, but not limited to, Aluminum (Al)/Titanium (Ti), Molybdenum (Mo), etc., which are coupled with an on opposing sides of the piezoelectric layer 110. In one embodiment, PMUT device also includes a third electrode, as illustrated in FIG. 10 and described below.

According to an embodiment, the acoustic impedance of acoustic coupling layer 114 is selected to be similar to the acoustic impedance of the platen layer 116, such that the acoustic wave is efficiently propagated to/from the membrane 120 through acoustic coupling layer 114 and platen layer 116. As an example, the platen layer 116 can comprise various materials having an acoustic impedance in the range between 0.8 to 4 MRayl, such as, but not limited to, plastic, resin, rubber, Teflon, epoxy, etc. In another example, the platen layer 116 can comprise various materials having a high acoustic impedance (e.g., an acoustic impendence greater than 10 MRayl), such as, but not limited to, glass, aluminum-based alloys, sapphire, etc. Typically, the platen layer 116 can be selected based on an application of the sensor. For instance, in fingerprinting applications, platen layer 116 can have an acoustic impedance that matches (e.g., exactly or approximately) the acoustic impedance of human skin (e.g., $1.6 \times 10^6$ Rayl). Further, in one aspect, the platen layer 116 can further include a thin layer of anti-scratch material. In various embodiments, the anti-scratch layer of the platen layer 116 is less than the wavelength of the acoustic wave that is to be generated and/or sensed to provide minimum interference during propagation of the acoustic wave. As an example, the anti-scratch layer can comprise various hard and scratch-resistant materials (e.g., having a Mohs hardness of over 7 on the Mohs scale), such as, but not limited to sapphire, glass, MN, Titanium nitride (TiN), Silicon carbide (SiC), diamond, etc. As an example, PMUT device 100 can operate at 20 MHz and accordingly, the wavelength of the acoustic wave propagating through the acoustic coupling layer 114 and platen layer 116 can be 70-150 microns. In this example scenario, insertion loss can be reduced and acoustic wave propagation efficiency can be improved by utilizing an anti-scratch layer having a thickness of 1 micron and the platen layer 116 as a whole having a thickness of 1-2 millimeters. It is noted that the term "anti-scratch material" as used herein relates to a material that is resistant to scratches and/or scratch-proof and provides substantial protection against scratch marks.

In accordance with various embodiments, the PMUT device 100 can include metal layers (e.g., Aluminum (Al)/Titanium (Ti), Molybdenum (Mo), etc.) patterned to form electrode 106 in particular shapes (e.g., ring, circle, square, octagon, hexagon, etc.) that are defined in-plane with the membrane 120. Electrodes can be placed at a maximum strain area of the membrane 120 or placed at close to either or both the surrounding edge support 102 and interior support 104. Furthermore, in one example, electrode 108 can be formed as a continuous layer providing a ground plane in contact with mechanical support layer 112, which can be formed from silicon or other suitable mechanical stiffening material. In still other embodiments, the electrode 106 can be routed along the interior support 104, advantageously reducing parasitic capacitance as compared to routing along the edge support 102.

For example, when actuation voltage is applied to the electrodes, the membrane 120 will deform and move out of plane. The motion then pushes the acoustic coupling layer 114 it is in contact with and an acoustic (ultrasonic) wave is generated. Oftentimes, vacuum is present inside the cavity 130 and therefore damping contributed from the media within the cavity 130 can be ignored. However, the acoustic coupling layer 114 on the other side of the membrane 120 can substantially change the damping of the PMUT device 100. For example, a quality factor greater than 20 can be observed when the PMUT device 100 is operating in air with atmosphere pressure (e.g., acoustic coupling layer 114 is air) and can decrease lower than 2 if the PMUT device 100 is operating in water (e.g., acoustic coupling layer 114 is water).

Figure 3:
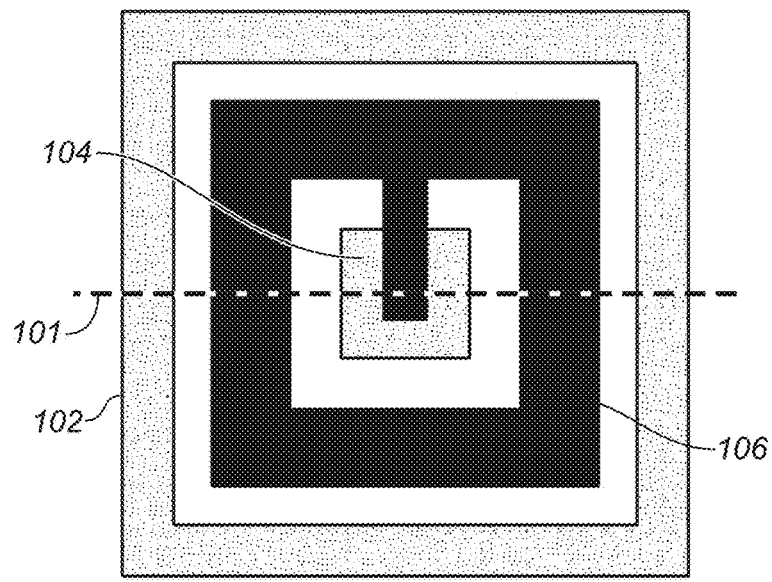
FIG. 3 is a top view of the PMUT device of FIG. 1, according to some embodiments.

FIG. 3 is a top view of the PMUT device 100 of FIG. 1 having a substantially square shape, which corresponds in part to a cross section along dotted line 101 in FIG. 3. Layout of surrounding edge support 102, interior support 104, and lower electrode 106 are illustrated, with other continuous layers not shown. It should be appreciated that the term "substantially" in "substantially square shape" is intended to convey that a PMUT device 100 is generally square-shaped, with allowances for variations due to manufacturing processes and tolerances, and that slight deviation from a square shape (e.g., rounded corners, slightly wavering lines, deviations from perfectly orthogonal corners or intersections, etc.) may be present in a manufactured device. While a generally square arrangement PMUT device is shown, alternative embodiments including rectangular, hexagon, octagonal, circular, or elliptical are contemplated. In other embodiments, more complex electrode or PMUT device shapes can be used, including irregular and non-symmetric layouts such as chevrons or pentagons for edge support and electrodes.

Figure 4:
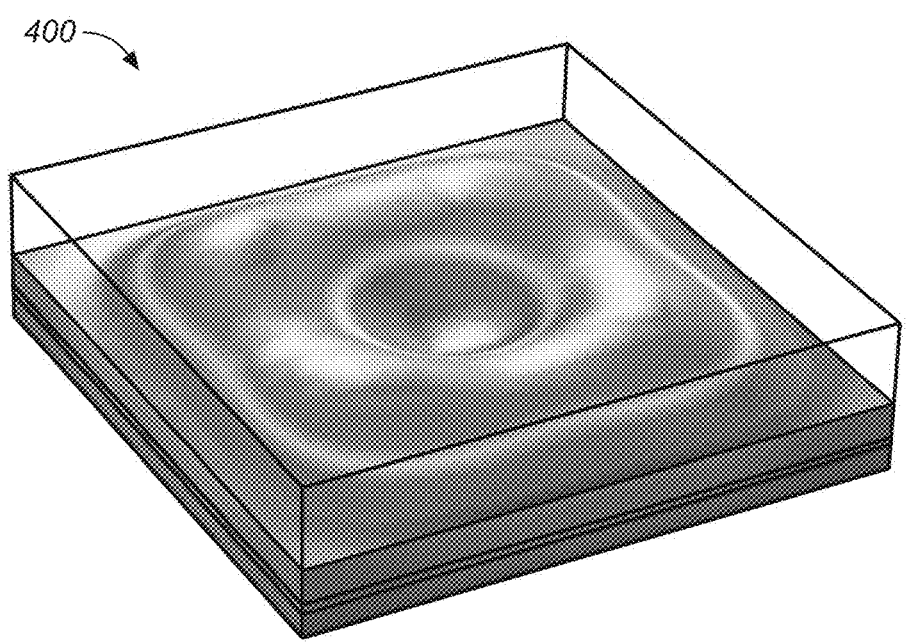
FIG. 4 is a simulated map illustrating maximum vertical displacement of the membrane of the PMUT device shown in FIGS. 1-3, according to some embodiments.

FIG. 4 is a simulated topographic map 400 illustrating maximum vertical displacement of the membrane 120 of the PMUT device 100 shown in FIGS. 1-3. As indicated, maximum displacement generally occurs along a center axis of the lower electrode, with corner regions having the greatest displacement. As with the other figures, FIG. 4 is not drawn to scale with the vertical displacement exaggerated for illustrative purposes, and the maximum vertical displacement is a fraction of the horizontal surface area comprising the PMUT device 100. In an example PMUT device 100, maximum vertical displacement may be measured in nanometers, while surface area of an individual PMUT device 100 may be measured in square microns.

Figure 5:
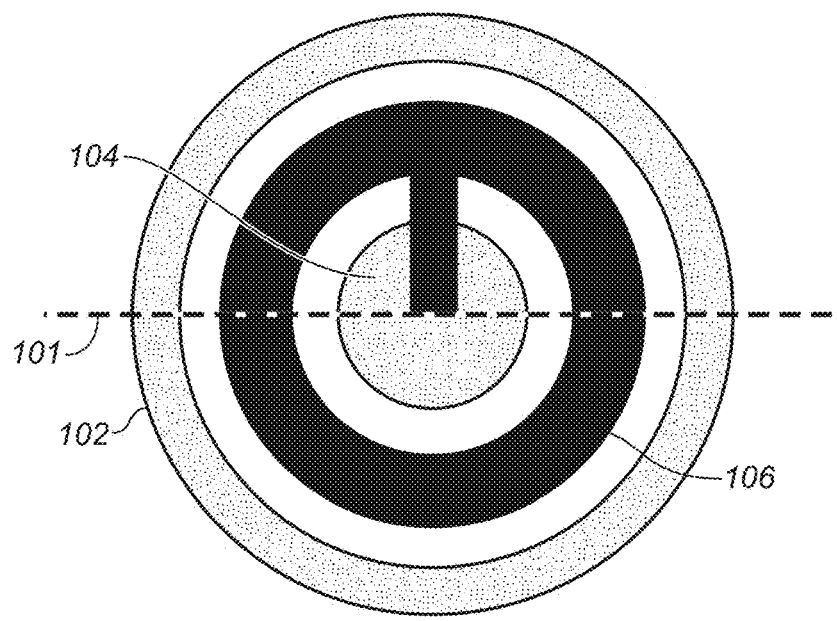
FIG. 5 is a top view of an example PMUT device having a circular shape, according to some embodiments.

FIG. 5 is a top view of another example of the PMUT device 100 of FIG. 1 having a substantially circular shape, which corresponds in part to a cross section along dotted line 101 in FIG. 5. Layout of surrounding edge support 102, interior support 104, and lower electrode 106 are illustrated, with other continuous layers not shown. It should be appreciated that the term "substantially" in "substantially circular shape" is intended to convey that a PMUT device 100 is generally circle-shaped, with allowances for variations due to manufacturing processes and tolerances, and that slight deviation from a circle shape (e.g., slight deviations on radial distance from center, etc.) may be present in a manufactured device.

Figure 6:
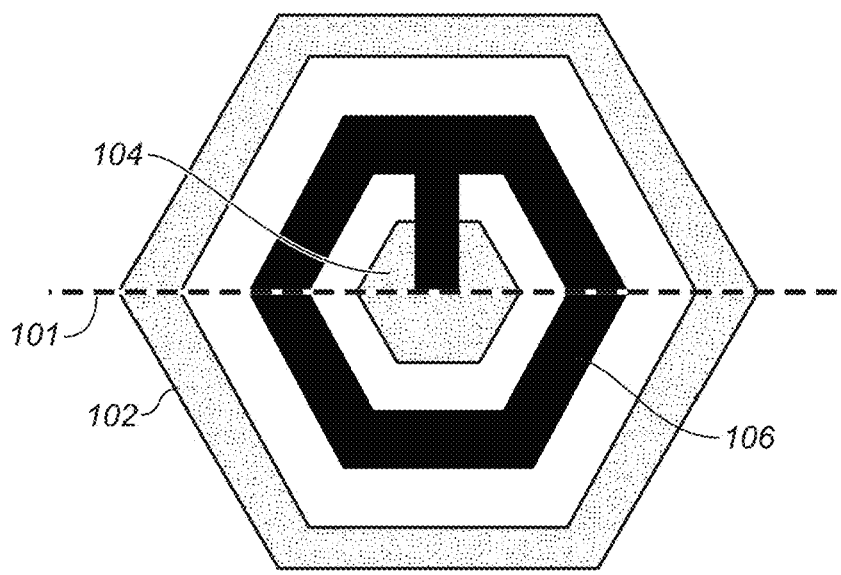
FIG. 6 is a top view of an example PMUT device having a hexagonal shape, according to some embodiments.

FIG. 6 is a top view of another example of the PMUT device 100 of FIG. 1 having a substantially hexagonal shape, which corresponds in part to a cross section along dotted line 101 in FIG. 6. Layout of surrounding edge support 102, interior support 104, and lower electrode 106 are illustrated, with other continuous layers not shown. It should be appreciated that the term "substantially" in "substantially hexagonal shape" is intended to convey that a PMUT device 100 is generally hexagon-shaped, with allowances for variations due to manufacturing processes and tolerances, and that slight deviation from a hexagon shape (e.g., rounded corners, slightly wavering lines, deviations from perfectly orthogonal corners or intersections, etc.) may be present in a manufactured device.

Figure 7:
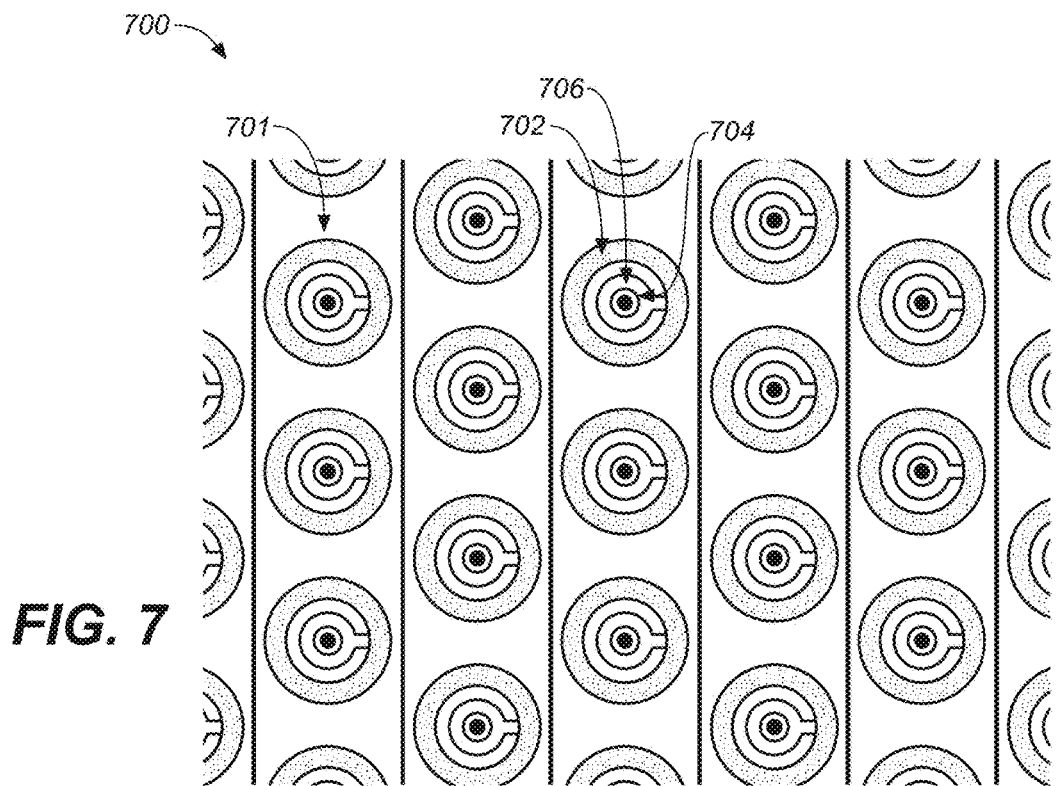
FIG. 7 illustrates an example array of circular-shaped PMUT devices, according to some embodiments.

FIG. 7 illustrates an example two-dimensional array 700 of circular-shaped PMUT devices 701 formed from PMUT devices having a substantially circular shape similar to that discussed in conjunction with FIGS. 1, 2 and 5. Layout of circular surrounding edge support 702, interior support 704, and annular or ring shaped lower electrode 706 surrounding the interior support 704 are illustrated, while other continuous layers are not shown for clarity. As illustrated, array 700 includes columns of circular-shaped PMUT devices 701 that are offset. It should be appreciated that the circular-shaped PMUT devices 701 may be closer together, such that edges of the columns of circular-shaped PMUT devices 701 overlap. Moreover, it should be appreciated that circular-shaped PMUT devices 701 may contact each other. In various embodiments, adjacent circular-shaped PMUT devices 701 are electrically isolated. In other embodiments, groups of adjacent circular-shaped PMUT devices 701 are electrically connected, where the groups of adjacent circular-shaped PMUT devices 701 are electrically isolated.

Figure 8:
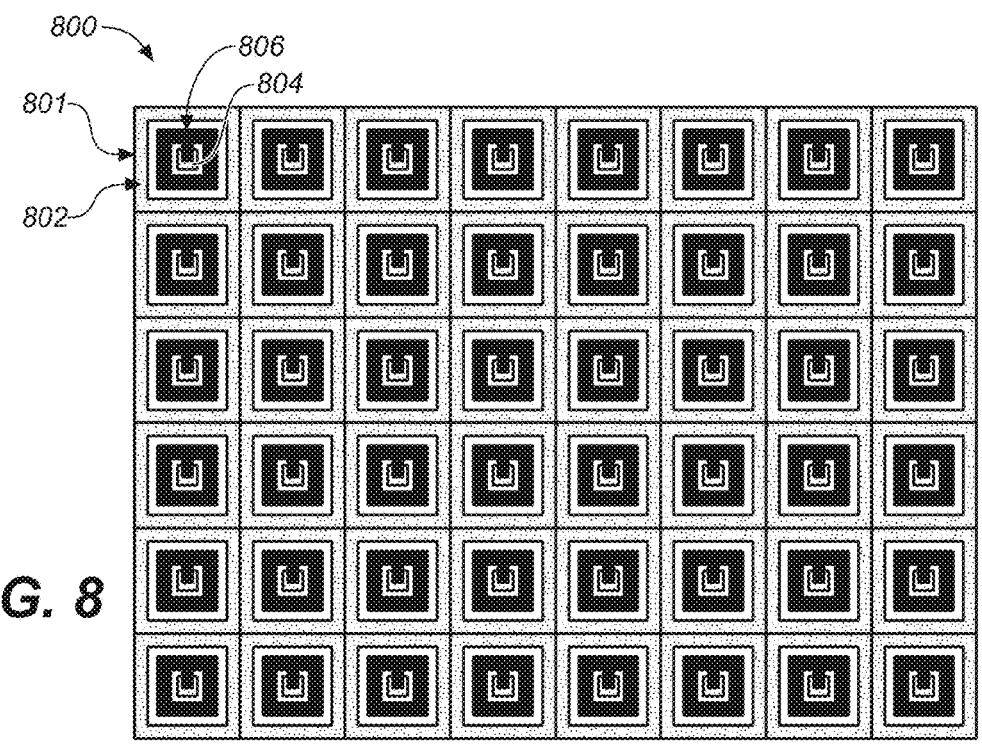
FIG. 8 illustrates an example array of square-shaped PMUT devices, according to some embodiments.

FIG. 8 illustrates an example two-dimensional array 800 of square-shaped PMUT devices 801 formed from PMUT devices having a substantially square shape similar to that discussed in conjunction with FIGS. 1, 2 and 3. Layout of square surrounding edge support 802, interior support 804, and square-shaped lower electrode 806 surrounding the interior support 804 are illustrated, while other continuous layers are not shown for clarity. As illustrated, array 800 includes columns of square-shaped PMUT devices 801 that are in rows and columns. It should be appreciated that rows or columns of the square-shaped PMUT devices 801 may be offset. Moreover, it should be appreciated that square-shaped PMUT devices 801 may contact each other or be spaced apart. In various embodiments, adjacent square-shaped PMUT devices 801 are electrically isolated. In other embodiments, groups of adjacent square-shaped PMUT devices 801 are electrically connected, where the groups of adjacent square-shaped PMUT devices 801 are electrically isolated.

Figure 9:
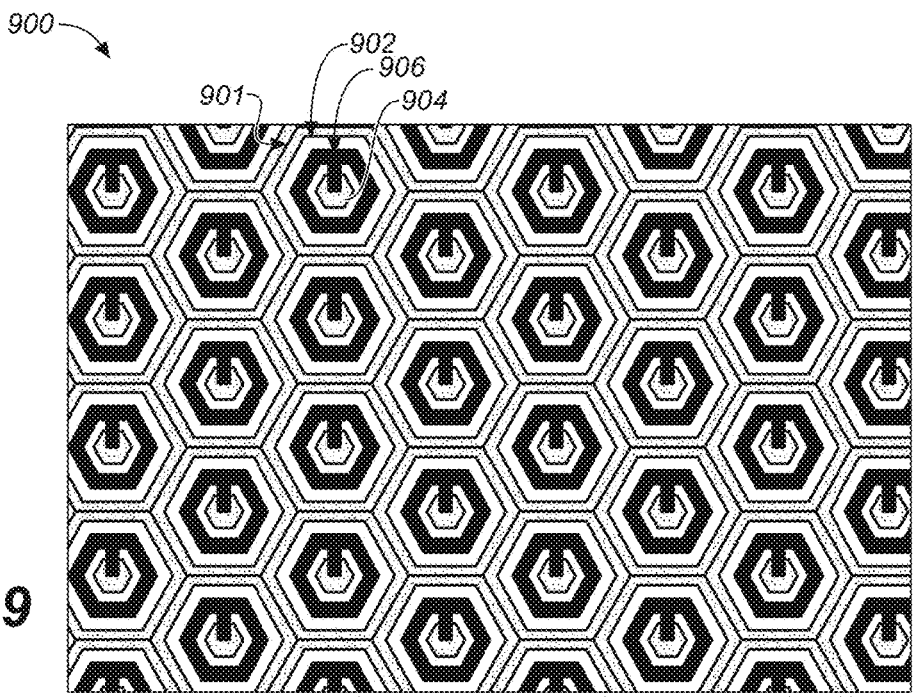
FIG. 9 illustrates an example array of hexagonal-shaped PMUT devices, according to some embodiments.

FIG. 9 illustrates an example two-dimensional array 900 of hexagon-shaped PMUT devices 901 formed from PMUT devices having a substantially hexagon shape similar to that discussed in conjunction with FIGS. 1, 2 and 6. Layout of hexagon-shaped surrounding edge support 902, interior support 904, and hexagon-shaped lower electrode 906 surrounding the interior support 904 are illustrated, while other continuous layers are not shown for clarity. It should be appreciated that rows or columns of the hexagon-shaped PMUT devices 901 may be offset. Moreover, it should be appreciated that hexagon-shaped PMUT devices 901 may contact each other or be spaced apart. In various embodiments, adjacent hexagon-shaped PMUT devices 901 are electrically isolated. In other embodiments, groups of adjacent hexagon-shaped PMUT devices 901 are electrically connected, where the groups of adjacent hexagon-shaped PMUT devices 901 are electrically isolated. While FIGS. 7, 8 and 9 illustrate example layouts of PMUT devices having different shapes, it should be appreciated that many different layouts are available. Moreover, in accordance with various embodiments, arrays of PMUT devices are included within a MEMS layer.

In operation, during transmission, selected sets of PMUT devices in the two-dimensional array can transmit an acoustic signal (e.g., a short ultrasonic pulse) and during sensing, the set of active PMUT devices in the two-dimensional array can detect an interference of the acoustic signal with an object (in the path of the acoustic wave). The received interference signal (e.g., generated based on reflections, echoes, etc. of the acoustic signal from the object) can then be analyzed. As an example, an image of the object, a distance of the object from the sensing component, a density of the object, a motion of the object, etc., can all be determined based on comparing a frequency and/or phase of the interference signal with a frequency and/or phase of the acoustic signal. Moreover, results generated can be further analyzed or presented to a user via a display device (not shown).

FIG. 10 illustrates a pair of example PMUT devices 1000 in a PMUT array, with each PMUT sharing at least one common edge support 1002. As illustrated, the PMUT devices have two sets of independent lower electrode labeled as 1006 and 1026. These differing electrode patterns enable antiphase operation of the PMUT devices 1000, and increase flexibility of device operation. In one embodiment, the pair of PMUTs may be identical, but the two electrodes could drive different parts of the same PMUT antiphase (one contracting, and one extending), such that the PMUT displacement becomes larger. While other continuous layers are not shown for clarity, each PMUT also includes an upper electrode (e.g., upper electrode 108 of FIG. 1). Accordingly, in various embodiments, a PMUT device may include at least three electrodes.

FIGS. 11A, 11B, 11C, and 11D illustrate alternative examples of interior support structures, in accordance with various embodiments. Interior supports structures may also be referred to as "pinning structures," as they operate to pin the membrane to the substrate. It should be appreciated that interior support structures may be positioned anywhere within a cavity of a PMUT device, and may have any type of shape (or variety of shapes), and that there may be more than one interior support structure within a PMUT device. While FIGS. 11A, 11B, 11C, and 11D illustrate alternative examples of interior support structures, it should be appreciated that these examples or for illustrative purposes, and are not intended to limit the number, position, or type of interior support structures of PMUT devices.

Figure 11A:
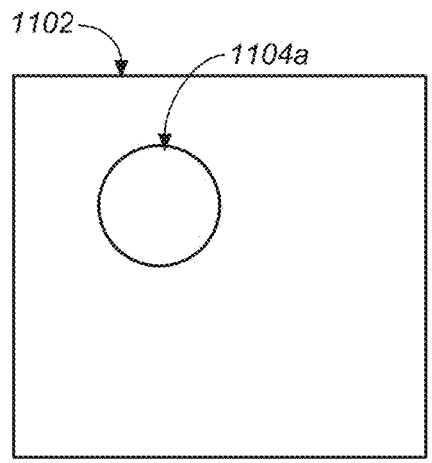
FIGS. 11A, 11B, 11C, and 11D illustrate alternative examples of interior support structures, according to various embodiments.
Figure 11B:
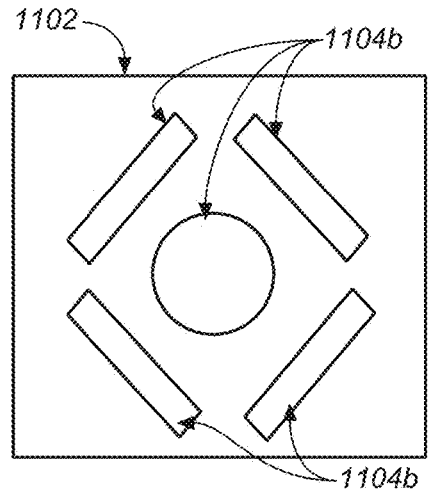
Figure 11C:
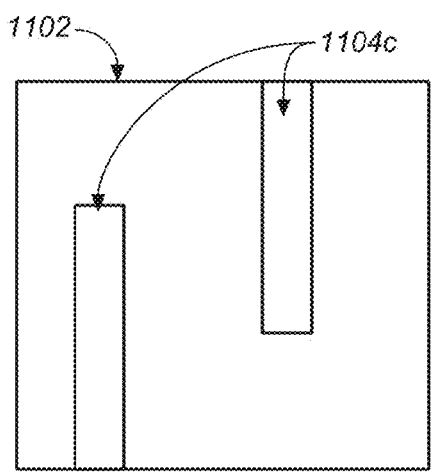
Figure 11D:
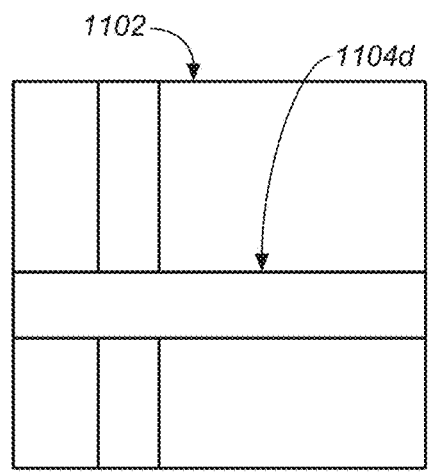

For example, interior supports structures do not have to be centrally located with a PMUT device area, but can be non-centrally positioned within the cavity. As illustrated in FIG. 11A, interior support 1104a is positioned in a non-central, off-axis position with respect to edge support 1102. In other embodiments such as seen in FIG. 11B, multiple interior supports 1104b can be used. In this embodiment, one interior support is centrally located with respect to edge support 1102, while the multiple, differently shaped and sized interior supports surround the centrally located support. In still other embodiments, such as seen with respect to FIGS. 11C and 11D, the interior supports (respectively 1104c and 1104d) can contact a common edge support 1102. In the embodiment illustrated in FIG. 11D, the interior supports 1104d can effectively divide the PMUT device into subpixels. This would allow, for example, activation of smaller areas to generate high frequency ultrasonic waves, and sensing a returning ultrasonic echo with larger areas of the PMUT device. It will be appreciated that the individual pinning structures can be combined into arrays.

Figure 12:
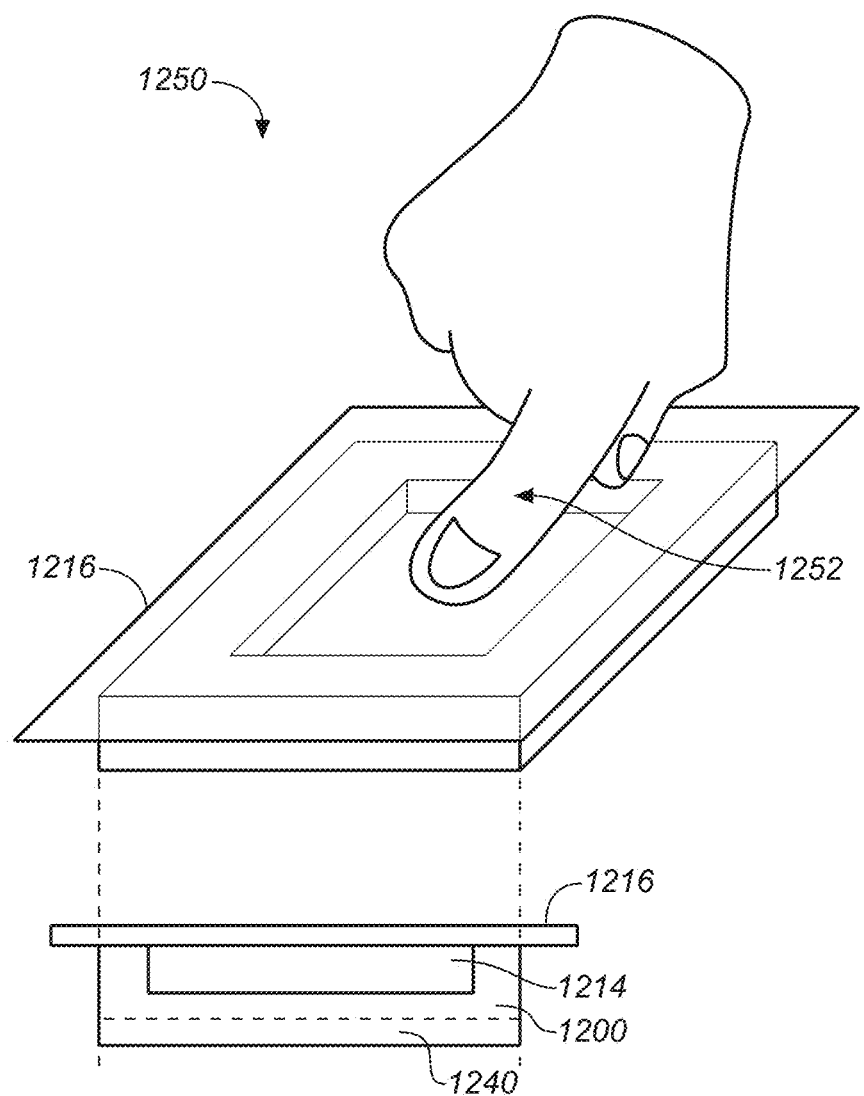
FIG. 12 illustrates a PMUT array used in an ultrasonic fingerprint sensing system, according to some embodiments.

FIG. 12 illustrates an embodiment of a PMUT array used in an ultrasonic fingerprint sensing system 1250. The fingerprint sensing system 1250 can include a platen 1216 onto which a human finger 1252 may make contact. Ultrasonic signals are generated and received by a PMUT device array 1200, and travel back and forth through acoustic coupling layer 1214 and platen 1216. Signal analysis is conducted using processing logic module 1240 (e.g., control logic) directly attached (via wafer bonding or other suitable techniques) to the PMUT device array 1200. It will be appreciated that the size of platen 1216 and the other elements illustrated in FIG. 12 may be much larger (e.g., the size of a handprint) or much smaller (e.g., just a fingertip) than as shown in the illustration, depending on the particular application.

In this example for fingerprinting applications, the human finger 1252 and the processing logic module 1240 can determine, based on a difference in interference of the acoustic signal with valleys and/or ridges of the skin on the finger, an image depicting epi-dermis and/or dermis layers of the finger. Further, the processing logic module 1240 can compare the image with a set of known fingerprint images to facilitate identification and/or authentication. Moreover, in one example, if a match (or substantial match) is found, the identity of user can be verified. In another example, if a match (or substantial match) is found, a command/operation can be performed based on an authorization rights assigned to the identified user. In yet another example, the identified user can be granted access to a physical location and/or network/computer resources (e.g., documents, files, applications, etc.)

In another example, for finger-based applications, the movement of the finger can be used for cursor tracking/movement applications. In such embodiments, a pointer or cursor on a display screen can be moved in response to finger movement. It is noted that processing logic module 1240 can include or be connected to one or more processors configured to confer at least in part the functionality of system 1250. To that end, the one or more processors can execute code instructions stored in memory, for example, volatile memory and/or nonvolatile memory.

Figure 13:
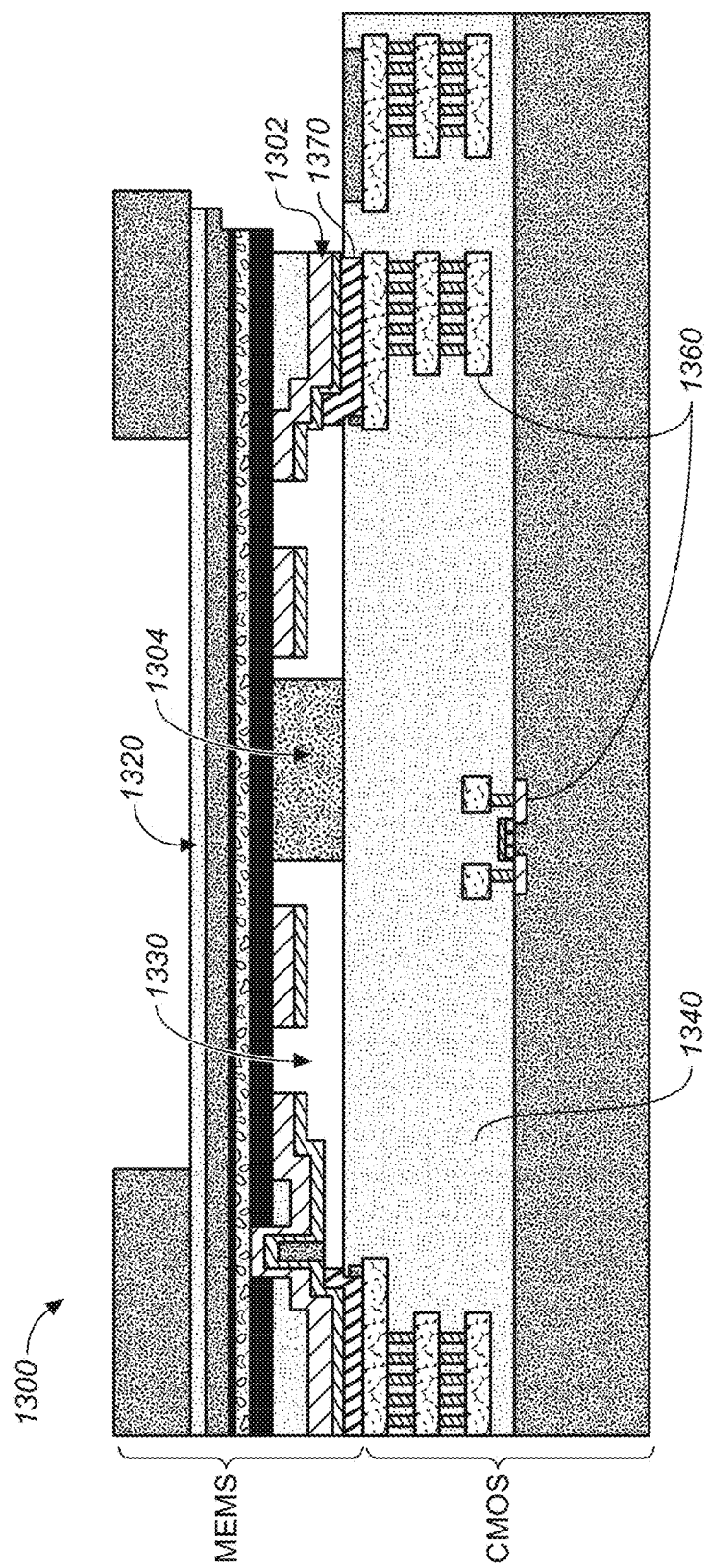
FIG. 13 illustrates an example integrated fingerprint sensor formed by wafer bonding a CMOS logic wafer and a microelectromechanical (MEMS) wafer defining PMUT devices, according to some embodiments.

FIG. 13 illustrates an integrated sensor 1300 formed by wafer bonding a CMOS logic wafer and a MEMS wafer defining PMUT devices, according to some embodiments. FIG. 13 illustrates in partial cross section one embodiment of an integrated sensor formed by wafer bonding a substrate 1340 CMOS logic wafer and a MEMS wafer defining PMUT devices (e.g., PMUT device 100) having a common edge support 1302 and separate interior support 1304. For example, the MEMS wafer may be bonded to the CMOS logic wafer using aluminum and germanium eutectic alloys, as described in U.S. Pat. No. 7,442,570, via layer 1370. PMUT device 1300 has an interior pinned membrane 1320 (including a piezoelectric layer) formed over a cavity 1330. The membrane 1320 is attached both to a surrounding edge support 1302 and interior support 1304. The membrane 1320 is formed from multiple layers. In accordance with various embodiments, an integrated fingerprint sensor is made of multiple integrated sensor elements 1300 (or devices) arranged in a one- or two-dimensional array. Each device is defined by edge supports 1302 that bond the MEMS layer and the CMOS layer. Applications other than a PMUT may be supported, provided that a MEMS array with multiple elements is used.

The CMOS layer includes control electronics 1360. In various embodiments, control electronics 1360 are a sophisticated, mixed-signal design fabricated through Complementary Metal Oxide Semiconductor (CMOS) processes. In various embodiments, control electronics 1360 include low voltage (LV) digital logic to select an element (or pixel) in the array and to control behavior at the element level and include LV analog signal processing of a received signal (e.g., ultrasonic waveform). The control electronics includes high voltage (HV) devices that are used to actuate, amplify, or condition a signal transduced between the electrical domain on the one hand, and the mechanical domain on the other. The HV devices comprise separate NMOS and PMOS sections with respective transistors using negative channel or positive channel transmission. In the case of a PMUT, HV devices are used to generate a high voltage actuation waveform that is applied to a piezoelectric layer of membrane 1320 to transduce a signal from the electrical domain to the ultrasound domain. In various embodiments, the LV devices include separate NMOS and PMOS sections.

It may also be possible to integrate the MEMS and CMOS elements at a die level, rather than a wafer level. FIG. 13 illustrates an aspect ratio with layers substantially thicker than an actual device for clarity. FIG. 13 further illustrates a relatively symmetric and simplified cartoon of control electronics 1360 with much detail of an example six-layer CMOS process omitted.

A Two-Dimensional Array of CMOS Control Elements

Microelectromechanical systems (MEMS) devices are manufactured using semiconductor manufacturing processes, and interface with the world through mechanical, optical, or other means. Examples of inertial MEMS devices include accelerometers and gyroscopes from InvenSense, which measure linear and rotational motion. Examples of optical MEMS devices include switching devices, frequently including small, movable mirrors to reflect light in space. Display MEMS, such as a Digital Light Processor (DLP) also use small, movable mirrors to create images in the visible light spectrum. MEMS technology is further used in pressure sensors, microphones, inkjet printers, fingerprint sensors, and other applications. There are a number of benefits to MEMS technology. The use of semiconductor manufacturing allows devices to be small, uniform, and repeatable. Given these benefits, many individual MEMS devices are also organized as arrays of uniform, or at least similar, elements.

The mechanical or optical portions of a MEMS device require control and an interface to electronics, including the system electronics comprising an end-user device. The control electronics are typically provided through semiconductor technology like Complementary Metal Oxide Semiconductor (CMOS) electronics. The electronics to control a MEMS device may be sophisticated, mixed-signal designs. CMOS control electronics may include low voltage (LV) digital logic and analog signal processing to select an element in an array and to control behavior at the element level. The control electronics may also include high voltage (HV) devices that are used to actuate, amplify, or condition a signal transduced between the electrical domain on the one hand, and the mechanical or optical domain on the other. The HV devices may include separate NMOS and PMOS sections with respective transistors using negative channel or positive channel transmission. However, to the extent that the CMOS electronics include mixed-signals—and particularly with respect to HV NMOS and HV PMOS—design rules dictate separation between these types of elements.

For example, it may be the case that MEMS elements are added following the creation of CMOS control electronics through post-processing manufacturing steps. Alternatively, MEMS elements are made in a first wafer, control electronics made in a second wafer, and the first and second wafers bonded together to form a complete device. The bonding of elements from two separate wafers may occur at a die level or at a wafer level. There may also be benefits to wafer bonding in terms of packaging and robustness of a design. If the MEMS elements are an array of devices, there is typically a registration of each of the MEMS elements to the CMOS control elements, so that there is a one-to-one correspondence between each MEMS element in an array with a related block of control electronics. There is also likely to be some glue logic included in each of the blocks of control electronics to tie together the functioning of the entire array.

Although conventional MEMS device arrays with a generally one-to-one correspondence in control electronics provide many of the benefits of MEMS, they are also subject to limitations. In particular, if the CMOS control electronics include multiple types of elements—including LV devices (e.g., both LV NMOS and LV PMOS devices), HV NMOS devices and HV PMOS devices—the CMOS design rules required by a manufacturing process may impede the packing of a MEMS array due to constraints on how closely associated blocks of control electronics may be. This may limit the density of the array by requiring a certain minimum pitch size between elements. In turn, this may limit the size of the array by limiting the number of control lines that can fit within a properly spaced element and still conform to the design rules. This may limit the performance of individual elements in the array by limiting the voltage that can be driven through the control electronics and to the device. Embodiments described herein address these concerns by describing arrangements of CMOS control elements for use in the development and manufacture of MEMS device arrays.

For example, an image sensor including MEMS devices (e.g., PMUTs 100) is to be manufactured, where the MEMS devices have an area of approximately 70 microns by 70 microns. The corresponding CMOS control elements include semiconductor devices of three classes (e.g., LV devices, HV PMOS devices, and HV NMOS devices), but also must be held to the same 70 micron by 70 micron constraint. In the current example, spacing rules require that the HV PMOS devices and the HV NMOS devices are spaced at least 40 microns apart from semiconductor devices of other classes or types. Accordingly, it may not be possible to fit all semiconductor devices within each CMOS control element or, if they are made to fit within each CMOS control element, there may be a significant amount of unused space on the CMOS control element.

Embodiments of the systems described herein, relate to a MEMS array made of uniform, or essentially uniform, devices or elements (e.g., ultrasonic transducers). This may be a single dimensional array (e.g., a line) or a two-dimensional array (e.g., a grid). Associated with the MEMS array is mixed-signal control electronics laid out in a way such that there is a many-to-one correspondence between the layout of the control electronics and each MEMS device of the MEMS array. For example, a CMOS control electronics block may include one or more CMOS control element and may be associated with one or more MEMS devices. An example CMOS control electronics block may be laid out such that common portions of the two, three, or more MEMS devices are grouped together based on CMOS design rules. In one embodiment, HV NMOS portions of each of the one or more MEMS devices are grouped in a first area, HV PMOS portions of each of the one or more MEMS devices are grouped in a second area, etc. By providing an asymmetric layout of the control electronics (e.g., CMOS control elements include different semiconductor devices and/or are oriented differently), it is possible to overcome many of the limitations previously described with having a generally one-to-one correspondence between MEMS element and control electronics in a conventional MEMS array.

In an embodiment, the one-to-many blocks of control electronics are further laid out in alternating patterns, so that arrangement of the control electronics share well boundaries between blocks. For example, adjacent blocks of control electronics will include their respective HV NMOS portions along a shared edge. This further limits the impact of CMOS design rules that require spacing between HV NMOS portions and HV PMOS portions. In an example embodiment of this technique, a two-dimensional array of MEMS devices is provided. Control electronics including LV devices, HV NMOS devices and HV PMOS devices are arranged in blocks, each block of control electronics corresponding to two uniform, or substantially similar, MEMS devices. These two-pixel blocks of control electronics are arranged in stripes along the first dimension of the array and then alternatingly flipped along the second dimension of the array to comprise the entire array for control of the MEMS elements.

In an embodiment, a two-dimensional array of individual PMUT devices (e.g., PMUT device 100 of FIG. 1) corresponds with control electronics organized in two device blocks. The two device blocks include LV, HV NMOS, and HV PMOS portions. The LV portion further includes a central rotational asymmetry. The blocks and laid out in a stripe/flip arrangement corresponding to the PMUT array. The technique of the described embodiments applies to other types of MEMS arrays with integrated control electronics. This includes, but is not limited to, applications for inertial sensors, optical devices, display devices, pressure sensors, microphones, inkjet printers, and other applications of MEMS technology with integrated mixed-signal electronics for control. It should be appreciated that while the described embodiments may refer CMOS control elements for controlling MEMS devices and/or PMUT devices, that the described embodiments are not intended to be limited to such implementations.

Figure 14:
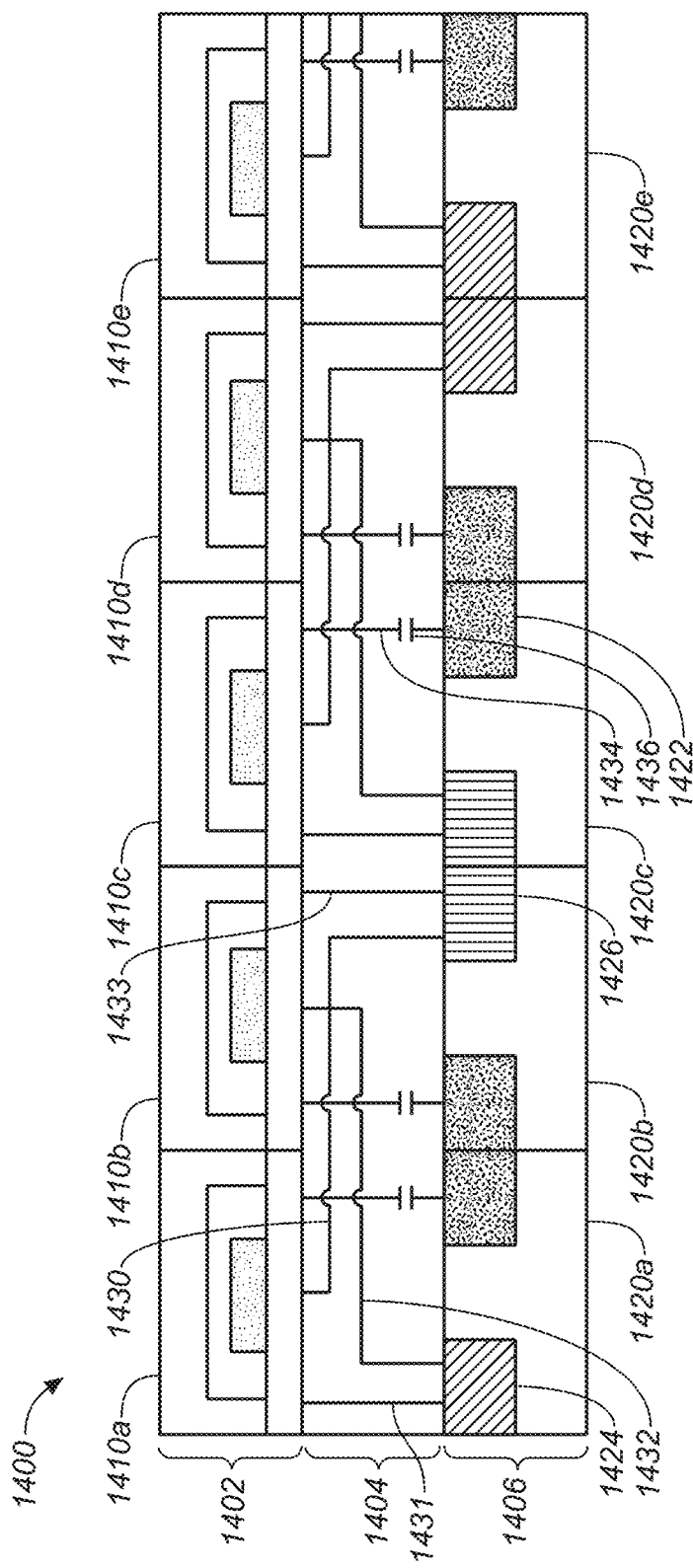
FIG. 14 illustrates an example sensing system, according to an embodiment.

FIG. 14 illustrates a cut-away side view of an example sensing system 1400, according to an embodiment. For example, sensing system 1400 may be a fingerprint sensing system for imaging and sensing a human fingerprint. In one embodiment, sensing system 1400 includes a device layer 1402 (e.g., a MEMS layer), an interconnect layer 1404, and a CMOS layer 1406. In the illustrated embodiment, five MEMS devices and five corresponding CMOS control elements are shown. However, it should be appreciated that sensing system 1400 may include any number of MEMS devices (or other devices) and CMOS control elements. Moreover, it should be appreciated that while a cut-away view is illustrated, that only a single row (or portion thereof) of device layer 1402 and CMOS layer 1406 is shown, and that device layer 1402 and CMOS layer 1406 may include arrays of corresponding components.

In one embodiment, device layer 1402 includes a plurality of devices 1410a-e (e.g., MEMS devices or PMUT devices) that are controllable by CMOS control elements 1420a-e of CMOS layer 1406. Interconnect layer 1404 is disposed between the device layer 1402 and CMOS layer 1406 and includes electrical connections for electrically coupling each devices 1410a-e to semiconductor device of the CMOS control layer 1406.

Figure 15:
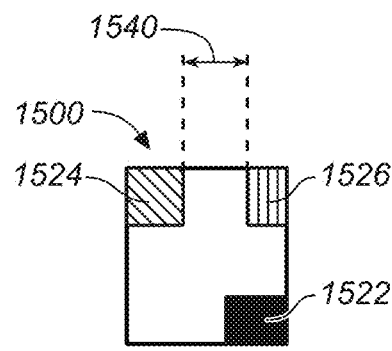
FIG. 15 illustrates an example CMOS control element including a semiconductor device of a first class, including a semiconductor device of a second class, and including a semiconductor device of a third class, according to an embodiment.

FIG. 15 illustrates an example CMOS control element including a semiconductor device of a first class (e.g., LV devices), including a semiconductor device of a second class (e.g., HV PMOS devices), and including a semiconductor device of a third class (e.g., HV NMOS devices), according to an embodiment. In one embodiment, FIG. 15 shows a layout for the control electronics (e.g., semiconductor devices) of one CMOS control element 1500 for a MEMS array where there is a one-to-one correspondence between one MEMS device and one CMOS control element. CMOS control element 1500 includes LV semiconductor devices (e.g., digital logic and/or analog signal processing) 1522 to select an element (or pixel) in the array and to control behavior at the element level. LV device 1522 logic includes small format CMOS circuits operating in saturation, linear, and cut-off modes for providing logical 0's and 1's for digital control. LV device also includes analog signal processing of a received signal (e.g., ultrasonic waveform). In one embodiment, the LV devices include both LV NMOS devices and LV PMOS devices.

CMOS control element 1500 further includes HV devices operating in analog or digital mode to actuate, amplify, or condition a signal transduced between the electrical domain on the one hand, and the mechanical domain on the other. The HV devices illustratively include a HV PMOS device 1524 and a separate HV NMOS device 1526. The transistors in the HV NMOS device 1526 use negative channel operation (electrons are conveyed). The transistors in the HV PMOS device 1524 use positive channel transmission (holes are conveyed). Design rules from the semiconductor process impose spacing constraints on the layout of mixed-signal CMOS control element 1500. For example, separation 1540 is required between HV PMOS section 1524 and HV NMOS section 1526. In one example, a distance of 40 microns is required between HV PMOS section 1524 and HV NMOS section 1526.

Figure 16:
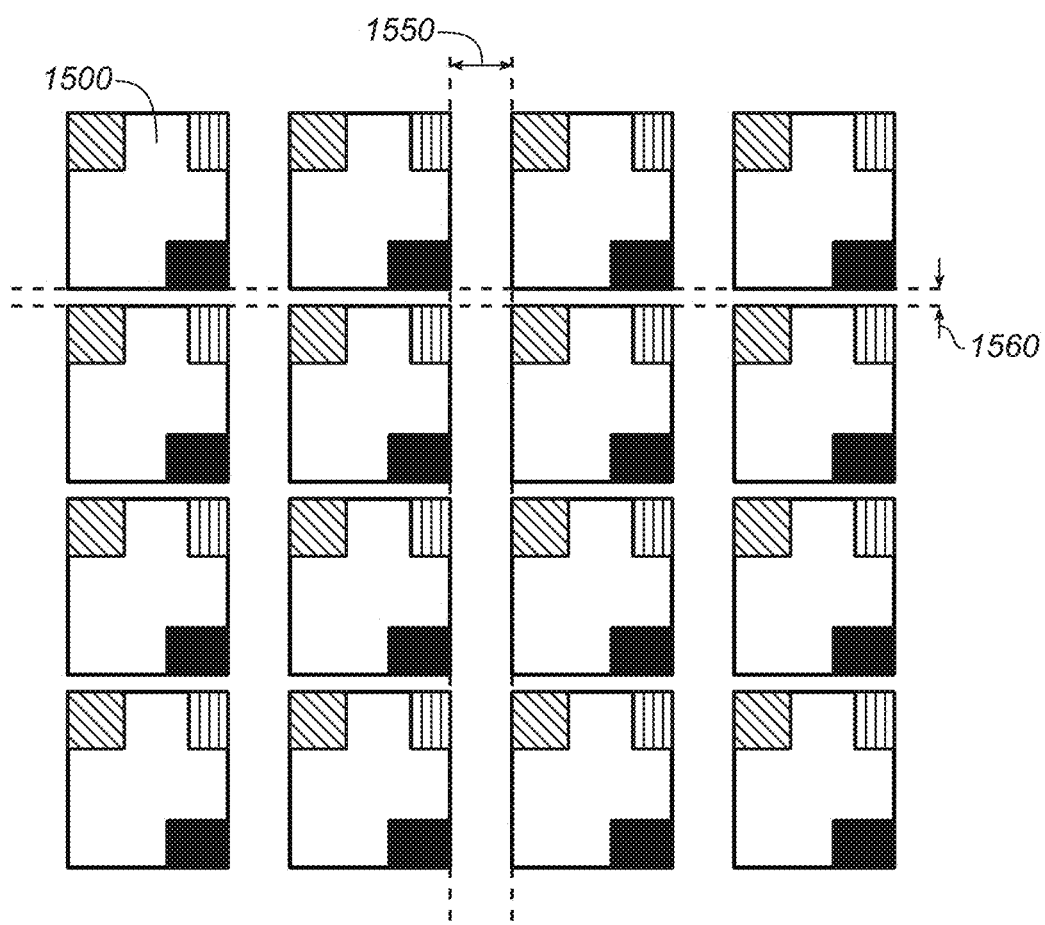
FIG. 16 illustrates an example two-dimensional array of CMOS control elements of FIG. 15 having a first arrangement, according to an embodiment.

FIG. 16 illustrates an example two-dimensional array of CMOS control elements 1500 of FIG. 15 having a first arrangement, according to an embodiment. FIG. 16 shows a layout of multiple CMOS control elements 1500 in a two-dimensional array configuration. The example array of CMOS control elements 1500 is 4×4, comprising 16 CMOS control elements. However, it should be appreciated that this example configuration can be utilized within an array of any number of CMOS control elements, and is not limited to the illustrated embodiment. In one embodiment, associated with each pixel of the control block is one MEMS device (not shown). The MEMS device may be a PMUT element, or another type of MEMS element. The design rules from the semiconductor process may prevent the array from being closely packed. Separation 1550 between HV NMOS section and HV PMOS section is similar to separation 1540 between these sections within a single control block. Separation 1560 between LV devices and HV NMOS devices is also shown.

It should be appreciated that separation 1550 and 1560 may be the same distance or a different distance, depending on the design specification. In one embodiment, where all HV devices (NMOS or PMOS) must be separated from other devices (HV or LV) by the same distance, separation 1550 and 1560 are the same distance. In one example embodiment, separation 1550 and 1560 is at least 40 microns. It should be appreciated that these separations are illustrative and not drawn to scale. With regard to FIG. 16 and the other example embodiments shown here, the use of different sized arrays, non-symmetric arrays (i.e., N×M), and non-square pixels (such as circles, ovals, rectangles, hexagons, and other shapes) is contemplated, and the embodiments envisioned are not to be limited to the described embodiments.

Figure 17:
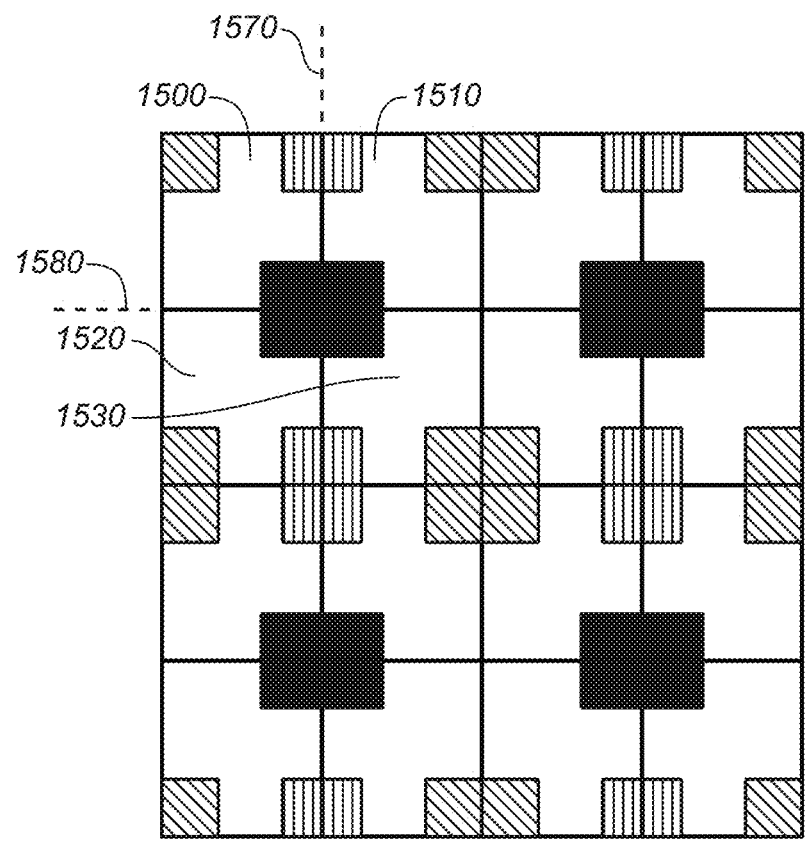
FIG. 17 illustrates an example two-dimensional array of CMOS control elements of FIG. 15 having a second arrangement, according to an embodiment.

FIG. 17 illustrates another example two-dimensional array of CMOS control elements of FIG. 15 having a second arrangement, according to an embodiment. FIG. 17 shows an alternative layout of CMOS control elements in a two-dimensional array configuration, where some CMOS control elements have reflectional symmetry with other CMOS control elements and some CMOS control elements have 180 degree rotational symmetry with other CMOS control elements. FIG. 17 illustrates a 4×4 array of CMOS control elements, comprising 16 elements. However, it should be appreciated that this example configuration can be utilized within an array of any number of CMOS control elements, and is not limited to the illustrated embodiment. In one embodiment, there is a one-to-one correspondence between CMOS control elements and MEMS device (not shown).

The layout of FIG. 17 improves upon the layout of FIG. 16 by reducing (and potentially eliminating) the separation between adjacent CMOS control elements both vertically and horizontally. This improvement is accomplished by adjusting the layout within a control block. CMOS control element 1500 continues as a first type of control block. CMOS control elements 1510 has reflectional symmetry with CMOS control element 1500 along the adjacent edge as indicated by line 1570. In other words, CMOS control element 1500 is a mirror image of CMOS control element 1510 along line 1570. Similarly, CMOS control element 1500 has reflectional symmetry with CMOS control element 1520 along the adjacent edge as indicated by line 1580, CMOS control element 1510 has reflectional symmetry with CMOS control element 1530 along the adjacent edge as indicated by line 1580, and CMOS control element 1520 has reflectional symmetry with CMOS control element 1530 along the adjacent edge as indicated by line 1570. Moreover, as illustrated CMOS control element 1500 has 180 degree rotational symmetry with CMOS control element 1530 and CMOS control element 1510 has 180 degree rotational symmetry with CMOS control element 1520 about the adjacent corners (e.g., about the point defined by the intersection of lines 1570 and 1580.

The illustrated embodiment reduces/eliminates the spacing requirement by positioning the semiconductor devices within each CMOS control elements such that semiconductor devices of the same class are positioned adjacent to each other for adjacent CMOS control elements. For example, the HV NMOS device of CMOS control element 1500 is adjacent to the HV NMOS device of CMOS control element 1510. Where spacing requirements do not require that semiconductor devices of the same class have a separation width, this eliminates any spacing requirements between adjacent CMOS control elements (assuming that the CMOS control elements are of a sufficient dimension to allow for separation of semiconductor devices of different classes with the CMOS control element). The four element grouping of CMOS control elements 1500, 1510, 1520 and 1530 is repeated over the area of the array. In various embodiments, the adjacent edges of CMOS control elements share adjacent LV, HV NMOS, and HV PMOS regions.

Figure 18:
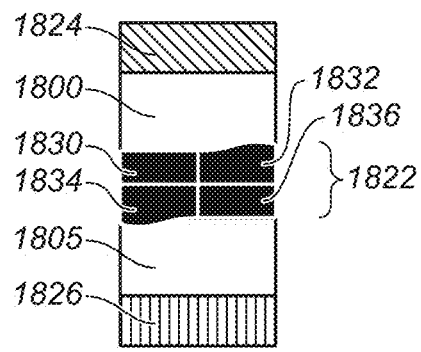
FIG. 18 illustrates an example CMOS control block including two CMOS control elements, where one CMOS control element includes a semiconductor device of a first class and a semiconductor device of a second class, and where the other CMOS control elements includes a semiconductor device of a first class and a semiconductor device of a third class, according to an embodiment.

FIG. 18 illustrates an example CMOS control block including two CMOS control elements, where one CMOS control element includes a semiconductor device of a first class (e.g., LV devices) and a semiconductor device of a second class (e.g., HV PMOS devices), and where the other CMOS control elements includes a semiconductor device of a first class and a semiconductor device of a third class (e.g., HV NMOS devices), according to an embodiment.

In one embodiment, FIG. 18 shows a layout for the control electronics (e.g., semiconductor devices) of one control block for a MEMS array where there is a two-to-one correspondence between two MEMS devices and one control block. The control block includes mixed-signal electronics associated with two MEMS devices. These MEMS devices may be similar, or substantially similar, while the single control block associates like kind elements between the two MEMS devices on certain parts of the control block. Section 1822 includes LV devices for two CMOS control elements 1800 and 1805. To improve performance of LV device 1822, there is symmetry in its layout where certain circuitry (e.g., LV PMOS device) for a first MEMS device is contained within sub-block 1830, while the corresponding circuitry for a second MEMS device is contained within sub-block 1832, located along a diagonal axis. In the example of control electronics for a PMUT device, diagonally oriented LV sub-blocks 1830 and 1832 may relate to the receiver circuits of the respective pixels. Thus, parasitic capacitance—unwanted capacitance that exists between the parts of an electronic circuit simply because of their proximity to each other—is limited during an active receive cycle involving both pixels. Similarly, other low voltage devices (e.g., LV NMOS devices) are located within sub-blocks 1834 and 1836.

The control block also includes high voltage circuits as a mixed signal device. HV PMOS device 1824 for use by two MEMS devices is located within CMOS control element 1800, HV NMOS device 1826 for use by two MEMS devices is located within CMOS control element 1805. In other words, the HV PMOS devices for two MEMS devices are contained within a first CMOS control element of the control block and the HV NMOS devices for two MEMS devices are within the second CMOS control element of the control block.

Symmetric layouts of portions of HV PMOS device 1824 and HV NMOS devices 1826 may be provided, similar to that shown with sub-blocks 1830 and 1832 for the LV devices. In total, grouping of like elements provides enhanced capabilities for the design and control of the MEMS system. This enables greater density of the array by limiting the number of constraints forcing certain minimum pitch sizes between CMOS control elements. This enables scaling of the array by creating more space for control lines to fit within a properly spaced CMOS control element and still conform to the design rules. This also enables enhanced performance of individual elements in the array by extending the voltage ranges that can be driven through the control electronics and to the associated device.

Figure 19:
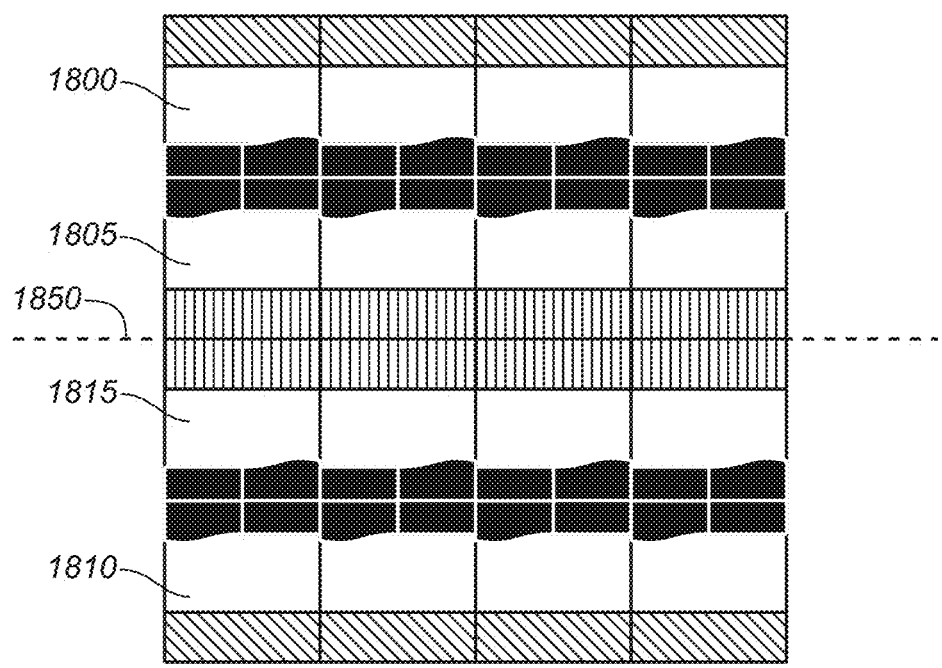
FIG. 19 illustrates an example two-dimensional array of CMOS control elements of FIG. 18, according to an embodiment.

FIG. 19 illustrates an example two-dimensional array of CMOS control elements of FIG. 18, according to an embodiment. FIG. 19 shows a layout for multiple control blocks of FIG. 18 in a two-dimensional array using an example stripe and flip configuration. FIG. 19 illustrates a 4×4 array of CMOS control elements, comprising 16 elements. In one embodiment, there is a one-to-two correspondence between control block and MEMS pixel (not shown). Thus, eight control blocks are illustrated in the example array. The first horizontal stripe of control blocks (the top two rows of CMOS control elements) includes four CMOS control elements 1800 and four CMOS control elements 1805. The second horizontal stripe of control blocks (the bottom two rows of CMOS control elements) includes CMOS control elements 1815 and four CMOS control elements 1810, where CMOS control elements 1815 have reflectional symmetry with CMOS control elements 1805 and CMOS control elements 1810 have reflectional symmetry with CMOS control elements 1800 along the adjacent edge as indicated by line 1850.

As illustrated, the CMOS control elements are positioned such that semiconductor devices of the same class are adjacent to each other (e.g., LV devices of CMOS control elements 1800 and 1805 are adjacent, and HV NMOS devices of CMOS control elements 1805 and 1815 are adjacent). It should be appreciated that while the semiconductor devices of the CMOS control elements are shown as being positioned extending horizontally across each CMOS control element, that the semiconductor devices may also be positioned vertically (e.g., rotated 90 degrees relative to the illustrated embodiment).

Figure 20:
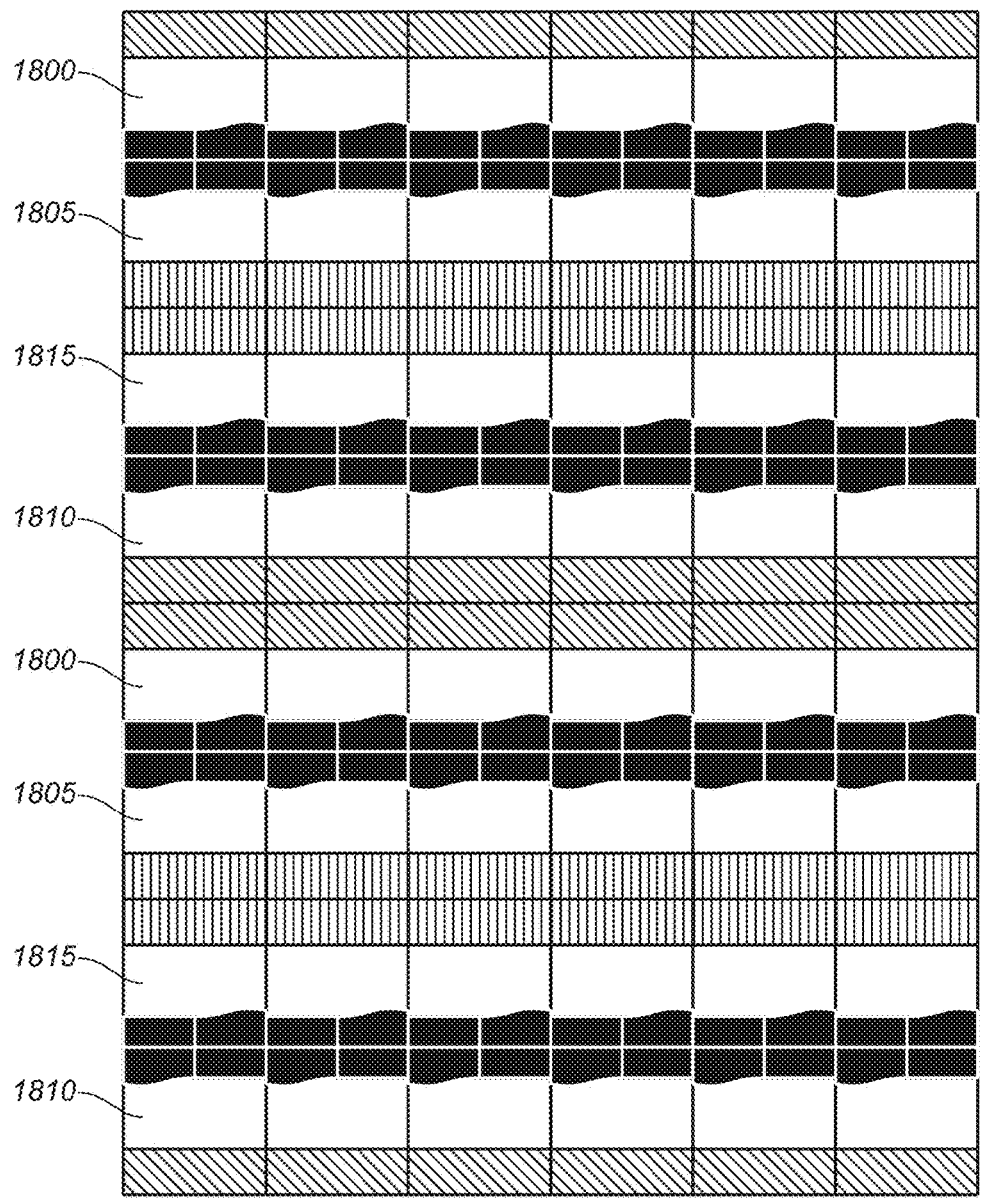
FIG. 20 illustrates an example two-dimensional array of CMOS control elements of FIG. 18, according to an embodiment.

FIG. 20 illustrates an example two-dimensional array of CMOS control elements of FIG. 18, according to an embodiment. FIG. 20 illustrates a similar layout of CMOS control elements as that shown in FIG. 19 within a larger array of CMOS control elements. FIG. 20 illustrates an 8×6 array of CMOS control elements, comprising 48 elements. As described above, it should be appreciated that any size of array of CMOS control elements is contemplated, of which the illustrated embodiments are examples. For example, the array of CMOS control elements may be 48×144, and utilize a similar layout pattern to that illustrated in FIG. 20. As illustrated in FIG. 20, the CMOS control elements are positioned such that semiconductor devices of the same class are positioned adjacent to each other.

Figure 21:
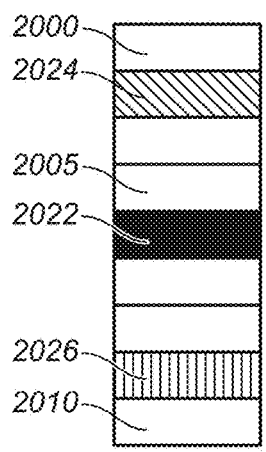
FIG. 21 illustrates an example CMOS control block including three CMOS control elements, where a first CMOS control element includes a semiconductor device of a first class, a second CMOS control element includes a semiconductor device of a second class, and a third CMOS control element includes a semiconductor device of a third class, according to an embodiment.

FIG. 21 illustrates an example CMOS control block including three CMOS control elements, where a first CMOS control element includes a semiconductor device of a first class (e.g., LV devices), a second CMOS control element includes a semiconductor device of a second class (e.g., HV PMOS devices), and a third CMOS control element includes a semiconductor device of a third class (e.g., HV NMOS devices), according to an embodiment.

The control block of FIG. 21 includes mixed-signal electronics associated with three MEMS devices. These MEMS devices may be similar, or substantially similar, while the single control block associates like kind elements between the two MEMS devices on certain parts of the control block. CMOS control element 2000 includes HV PMOS device 2024, CMOS control element 2005 includes LV device 2022, and CMOS control element 2010 includes HV NMOS device 2026. As illustrated, the semiconductor devices are positioned in approximately the middle of the respective CMOS control elements. However, it should be appreciated that the semiconductor devices may be positioned anywhere within the respective CMOS control elements, so long as the spacing requirements are satisfied when positioning the CMOS control elements within an array.

Figure 22:
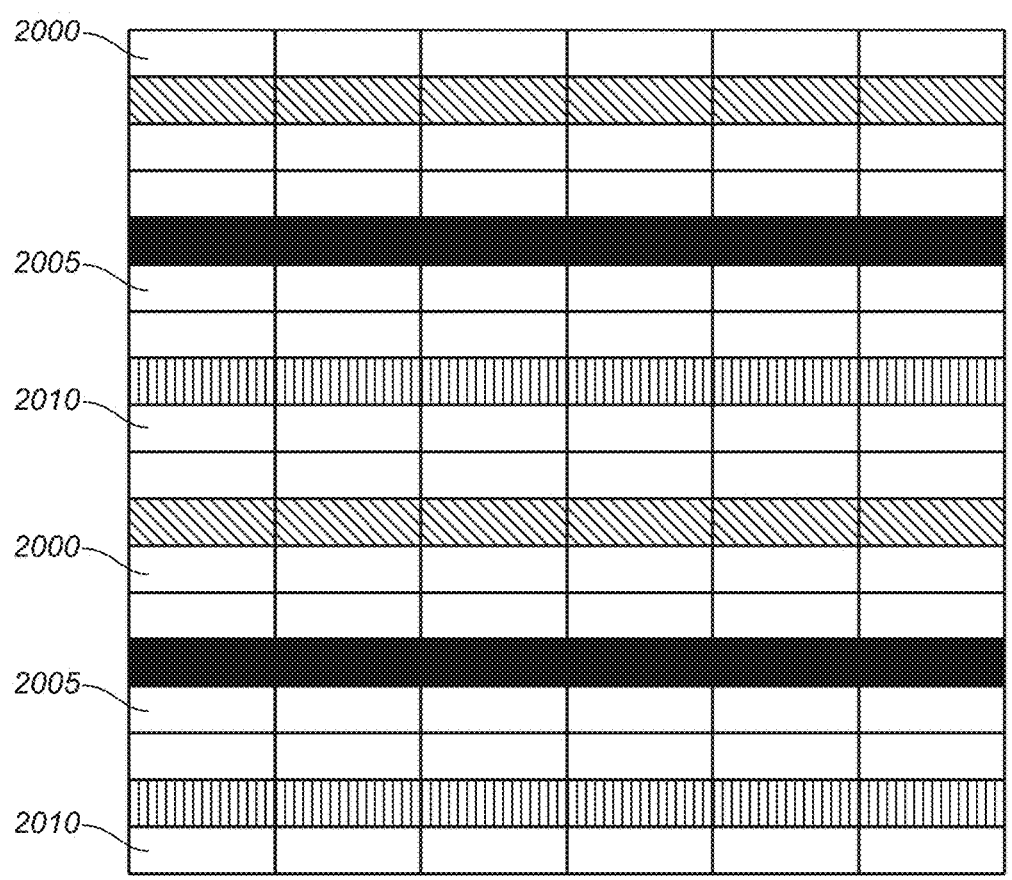
FIG. 22 illustrates an example two-dimensional array of CMOS control elements of FIG. 21 having a first arrangement, according to an embodiment.

FIG. 22 illustrates an example two-dimensional array of CMOS control elements of FIG. 21 having a first arrangement, according to an embodiment. FIG. 22 shows a layout for multiple control blocks of FIG. 21 in a two-dimensional array using a first stripe configuration. FIG. 22 illustrates a 6×6 array of CMOS control elements, comprising 36 elements. In one embodiment, there is a one-to-three correspondence between control block and MEMS device (not shown). Thus, twelve control blocks are illustrated in the example array. The first horizontal stripe of control blocks (the top three rows of CMOS control elements) includes six CMOS control elements 2000, six CMOS control elements 2005, and six CMOS control elements 2010. The second horizontal stripe of control blocks (the bottom three rows of CMOS control elements) repeats the layout of the first horizontal stripe. In other words, the rows of CMOS control elements are repeated in an ABCABC pattern, where A, B and C represents CMOS control elements having semiconductor devices of different classes.

Figure 23:
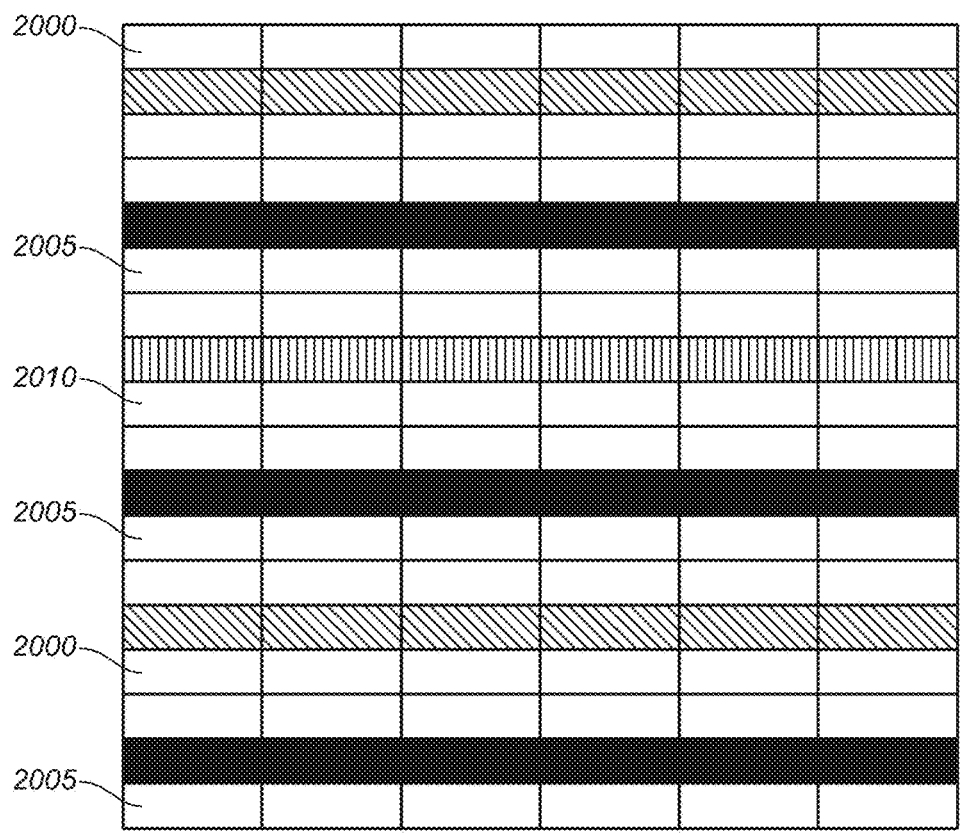
FIG. 23 illustrates an example two-dimensional array of CMOS control elements of FIG. 21 having a second arrangement, according to an embodiment.

FIG. 23 illustrates an example two-dimensional array of CMOS control elements of FIG. 21 having a second arrangement, according to an embodiment. FIG. 23 illustrates a 6×6 array of CMOS control elements, comprising 36 elements. The first (top) row of CMOS control elements includes six CMOS control elements 2000, the second row includes six CMOS control elements 2005, the third row includes six CMOS control elements 2010, the fourth row includes six CMOS control elements 2005, the fifth row includes six CMOS control elements 2000, and the sixth row includes six CMOS control elements 2005. In other words, the rows of CMOS control elements are repeated in an ABACAB pattern, where A, B and C represents CMOS control elements having semiconductor devices of different classes.

Figure 24:
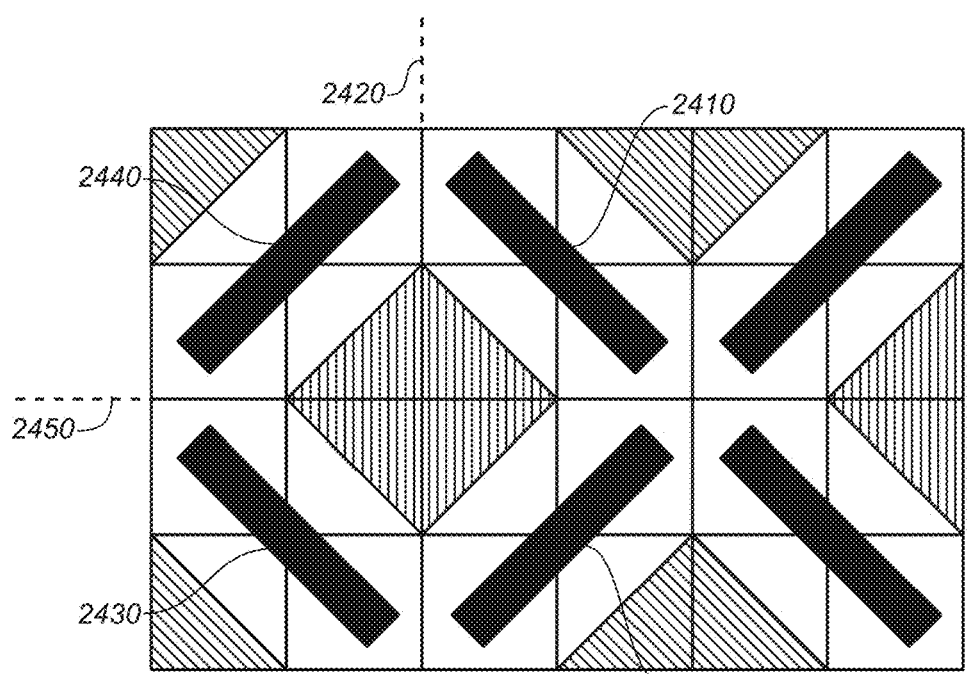
FIG. 24 illustrates an example two-dimensional array of CMOS control elements, according to an embodiment.

FIG. 24 illustrates an example two-dimensional array of CMOS control elements, according to an embodiment. FIG. 24 illustrates a 4×6 array of CMOS control elements, comprising 24 elements. However, it should be appreciated that this example configuration can be utilized within an array of any number of CMOS control elements, and is not limited to the illustrated embodiment. In one embodiment, associated with each pixel of the control block is one MEMS device (not shown). The MEMS device may be a PMUT element, or another type of MEMS element.

As illustrated, control block 2440 includes four CMOS control elements, where the semiconductor devices are positioned within the CMOS control elements of control block 2440 as shown. Control block 2410 is a mirror image of control block 2440 along line 2420, and associates together adjacent HV NMOS sections of the eight devices in the first 2×4 portion of the array along the edge defined by line 2420. Control blocks 2430 and 2460 are respectively mirror images of control blocks 2440 and 2410 along line 2450. The 16 pixel grouping of control blocks 2440, 2410, 2430 and 2460 are then repeated. The borders share adjacent LV, HV NMOS, and HV PMOS regions. In this example, only a half pattern is repeated for the rightmost two columns.

In other examples, spacing rules may dictate that an HV PMOS device must be separated from any NMOS device by a specified separation distance and that an HV NMOS device must be separated from any PMOS device by a specified separation distance. However, in the current examples, these spacing rules do not require that HV PMOS devices have a similar separation distance from LV PMOS device and that HV NMOS devices have a similar separation distance from LV NMOS device. For example, an image sensor including MEMS devices (e.g., PMUTs 100) is to be manufactured, where the MEMS devices have an area of approximately 70 microns by 70 microns. The corresponding CMOS control elements include HV PMOS devices, LV PMOS devices, HV NMOS devices and LV NMOS devices, but also must be held to the same 70 micron by 70 micron constraint. In the current example, spacing rules require that the HV PMOS devices are spaced at least 40 microns apart from any NMOS device and that the HV NMOS devices are spaced at least 40 microns apart from any PMOS device. Accordingly, it may not be possible to fit all semiconductor devices within each CMOS control element or, if they are made to fit within each CMOS control element, there may be a significant amount of unused space on the CMOS control element.

Embodiments of the systems described herein, relate to a MEMS array made of uniform, or essentially uniform, devices or elements (e.g., ultrasonic transducers). This may be a single dimensional array (e.g., a line) or a two-dimensional array (e.g., a grid). Associated with the MEMS array is mixed-signal control electronics laid out in a way such that there is a one-to-one or many-to-one correspondence between the layout of the control electronics and each MEMS device of the MEMS array. For example, a CMOS control electronics block may include one or more CMOS control element and may be associated with one or more MEMS devices. An example CMOS control electronics block may be laid out such that common portions of the two, three, or more MEMS devices are grouped together based on CMOS design rules. In one embodiment, NMOS portions of each of the one or more MEMS devices are grouped in a first area and PMOS portions of each of the one or more MEMS devices are grouped in a second area. By providing an asymmetric layout of the control electronics (e.g., CMOS control elements include different semiconductor devices and/or are oriented differently), it is possible to overcome many of the limitations previously described with having a generally one-to-one correspondence between MEMS element and control electronics in a conventional MEMS array.

In an embodiment, the one-to-many blocks of control electronics are further laid out in alternating patterns, so that arrangement of the control electronics share well boundaries between blocks. For example, adjacent blocks of control electronics will include their respective NMOS portions along a shared edge, where the NMOS portions include HV NMOS semiconductor devices and LV NMOS semiconductor devices. This further limits the impact of CMOS design rules that require spacing between HV NMOS portions and any PMOS portions. In an example embodiment of this technique, a two-dimensional array of MEMS devices is provided. Control electronics including NMOS devices (LV and HV) and PMOS devices (LV and HV) are arranged in blocks, each block of control electronics corresponding to two uniform, or substantially similar, MEMS devices. These two-pixel blocks of control electronics are arranged in stripes along the first dimension of the array and then alternatingly flipped along the second dimension of the array to comprise the entire array for control of the MEMS elements.

In an embodiment, a two-dimensional array of individual PMUT devices (e.g., PMUT device 100 of FIG. 1) corresponds with control electronics organized in one or two device blocks. The device blocks include PMOS portions and NMOS portions. The blocks are laid out in a stripe/flip arrangement corresponding to the PMUT array. The technique of the described embodiments applies to other types of MEMS arrays with integrated control electronics. This includes, but is not limited to, applications for inertial sensors, optical devices, display devices, pressure sensors, microphones, inkjet printers, and other applications of MEMS technology with integrated mixed-signal electronics for control. It should be appreciated that while the described embodiments may refer to CMOS control elements for controlling MEMS devices and/or PMUT devices, that the described embodiments are not intended to be limited to such implementations.

Figure 25:
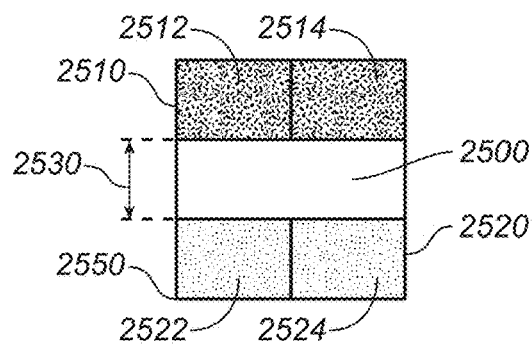
FIG. 25 illustrates an example CMOS control element including a PMOS semiconductor device portion and an NMOS semiconductor device portion, according to an embodiment.

FIG. 25 illustrates an example CMOS control element 2500 including a PMOS semiconductor device portion 2510 and an NMOS semiconductor device portion 2520, according to an embodiment. In the illustrated embodiment, PMOS semiconductor device portion 2510 includes both HV PMOS semiconductor device 2512 and LV PMOS semiconductor device 2514, and NMOS semiconductor device portion 2520 includes both HV NMOS semiconductor device 2522 and LV NMOS semiconductor device 2524. In one embodiment, FIG. 25 shows a layout for the control electronics (e.g., semiconductor devices) of one CMOS control element 2500 for a MEMS array where there is a one-to-one correspondence between one MEMS device and one CMOS control element. PMOS semiconductor device portion 2510 includes an LV PMOS semiconductor device 2512 (e.g., digital logic and/or analog signal processing), and NMOS semiconductor device portion 2520 includes an LV NMOS semiconductor device 2522, for selecting an element (or pixel) in the array and to control behavior at the element level. LV device logic includes small format CMOS circuits operating in saturation, linear, and cut-off modes for providing logical 0's and 1's for digital control and includes LV analog signal processing of a received signal (e.g., ultrasonic waveform).

PMOS semiconductor device portion 2510 further includes an HV PMOS semiconductor device 2514, and NMOS semiconductor device portion 2520 further includes an HV NMOS semiconductor device 2524, operating in analog or digital mode to actuate, amplify, or condition a signal transduced between the electrical domain on the one hand, and the mechanical domain on the other. The transistors in HV NMOS semiconductor device 2524 uses negative channel operation (electrons are conveyed). The transistors in the HV PMOS semiconductor device 2514 uses positive channel transmission (holes are conveyed). Design rules from the semiconductor process impose spacing constraints on the layout of mixed-signal CMOS control element 2500. For example, separation 2530 is required between PMOS semiconductor device portion 2510 and an NMOS semiconductor device portion 2520. In one example, a distance of 40 microns is required between PMOS semiconductor device portion 2510 and an NMOS semiconductor device portion 2520.

Figure 26:
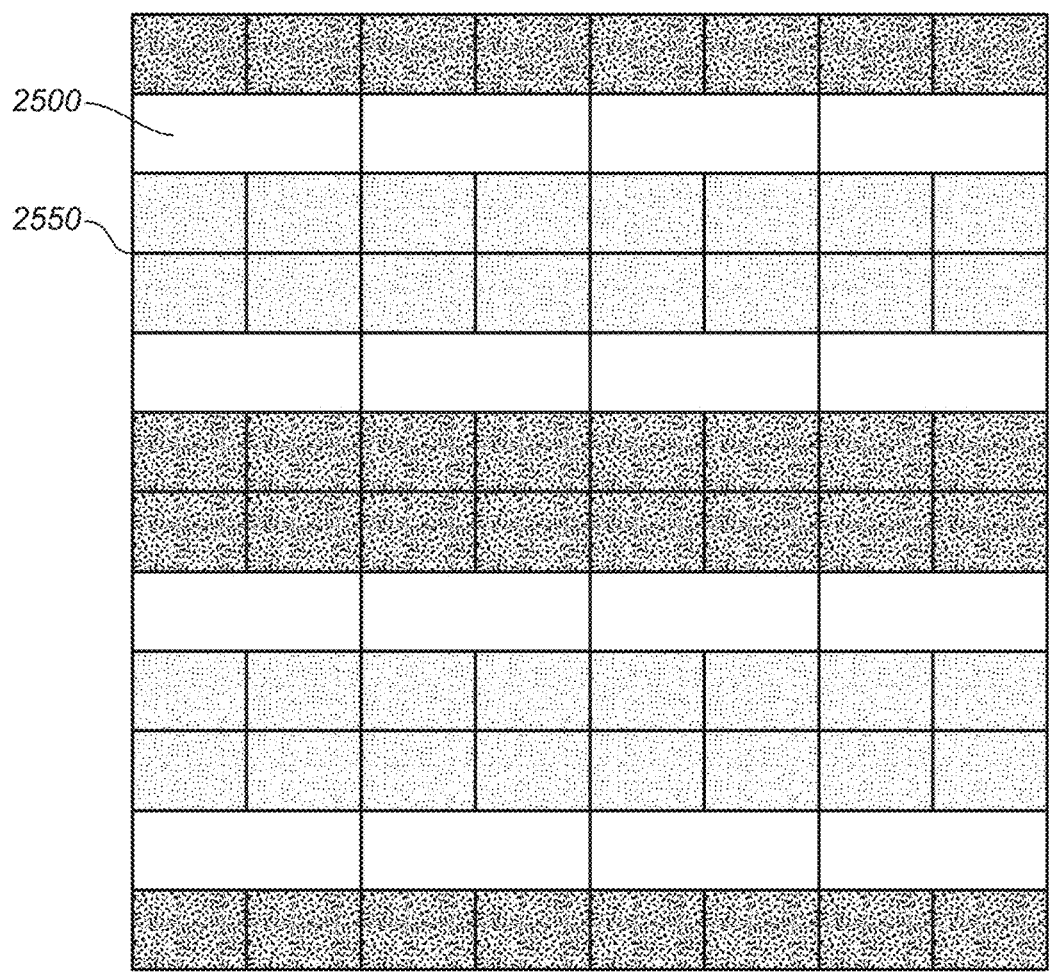
FIG. 26 illustrates an example two-dimensional array of CMOS control elements of FIG. 25, according to an embodiment.

FIG. 26 illustrates an example two-dimensional array of CMOS control elements of FIG. 25, according to an embodiment. FIG. 26 shows a layout for CMOS control elements 2500 of FIG. 25 in a two-dimensional array using an example stripe and flip configuration. FIG. 26 illustrates a 4×4 array of CMOS control elements, comprising 16 CMOS control elements 2500. However, it should be appreciated that this example configuration can be utilized within an array of any number of CMOS control elements, and is not limited to the illustrated embodiment. In one embodiment, there is a one-to-one correspondence between control block and MEMS pixel (not shown). Thus, sixteen control blocks are illustrated in the example array, where each CMOS control element is a control block.

As illustrated, the CMOS control elements 2500 are positioned such that PMOS semiconductor device portions are adjacent to each other and such that NMOS semiconductor device portions are adjacent to each other. For example, CMOS control elements 2500 of adjacent rows are positioned such that adjacent CMOS control elements have reflectional symmetry. For example, CMOS control elements 2500 of the top row have reflectional symmetry with CMOS control elements 250 of the second row along the adjacent edge as indicated by line 2550. It should be appreciated that while the semiconductor device portions of the CMOS control elements are shown as being positioned extending horizontally across each CMOS control element, that the semiconductor devices may also be positioned vertically (e.g., rotated 90 degrees relative to the illustrated embodiment).

Figure 27:
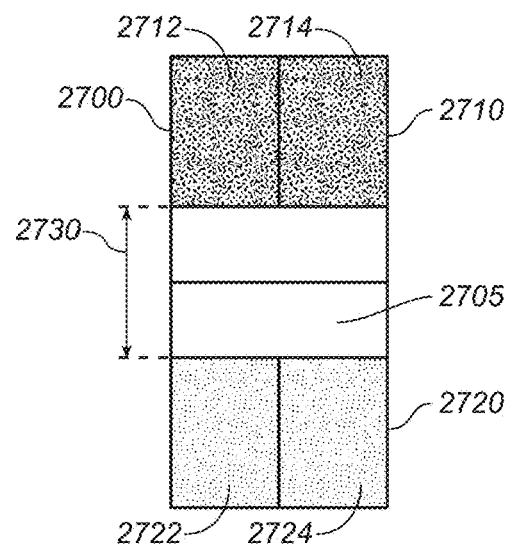
FIG. 27 illustrates an example CMOS control block including two CMOS control elements, where one CMOS control element includes a PMOS semiconductor device portion and where the other CMOS control element includes an NMOS semiconductor device portion, according to an embodiment.

FIG. 27 illustrates an example CMOS control block including two CMOS control elements 2700 and 2705, where CMOS control element 2700 includes a PMOS semiconductor device portion 2710 and where CMOS control element 2705 includes an NMOS semiconductor device portion 2720, according to an embodiment. In one embodiment, FIG. 27 shows a layout for the control electronics (e.g., semiconductor devices) of one control block for a MEMS array where there is a two-to-one correspondence between two MEMS devices and one control block. The control block includes mixed-signal electronics associated with two MEMS devices. These MEMS devices may be similar, or substantially similar, while the single control block associates like kind elements between the two MEMS devices on certain parts of the control block.

In the illustrated embodiment, PMOS semiconductor device portion 2710 of CMOS control element 2700 includes both HV PMOS semiconductor device 2712 and LV PMOS semiconductor device 2714. NMOS semiconductor device portion 2720 of CMOS control element 2705 includes both HV NMOS semiconductor device 2722 and LV NMOS semiconductor device 2724. PMOS semiconductor device portion 2710 includes an LV PMOS semiconductor device 2712 (e.g., digital logic and/or analog signal processing), and NMOS semiconductor device portion 2720 includes an LV NMOS semiconductor device 2722, for selecting an element (or pixel) in the array and to control behavior at the element level. LV device logic includes small format CMOS circuits operating in saturation, linear, and cut-off modes for providing logical 0's and 1's for digital control and includes LV analog signal processing of a received signal (e.g., ultrasonic waveform).

PMOS semiconductor device portion 2710 further includes an HV PMOS semiconductor device 2714, and NMOS semiconductor device portion 2720 further includes an HV NMOS semiconductor device 2724, operating in analog or digital mode to actuate, amplify, or condition a signal transduced between the electrical domain on the one hand, and the mechanical domain on the other. The transistors in HV NMOS semiconductor device 2724 uses negative channel operation (electrons are conveyed). The transistors in the HV PMOS semiconductor device 2714 uses positive channel transmission (holes are conveyed). Design rules from the semiconductor process impose spacing constraints on the layout of mixed-signal CMOS control elements 2700 and 2705. For example, separation 2730 is required between PMOS semiconductor device portion 2710 and an NMOS semiconductor device portion 2720. In one example, a distance of 40 microns is required between PMOS semiconductor device portion 2710 and an NMOS semiconductor device portion 2720.

Figure 28:
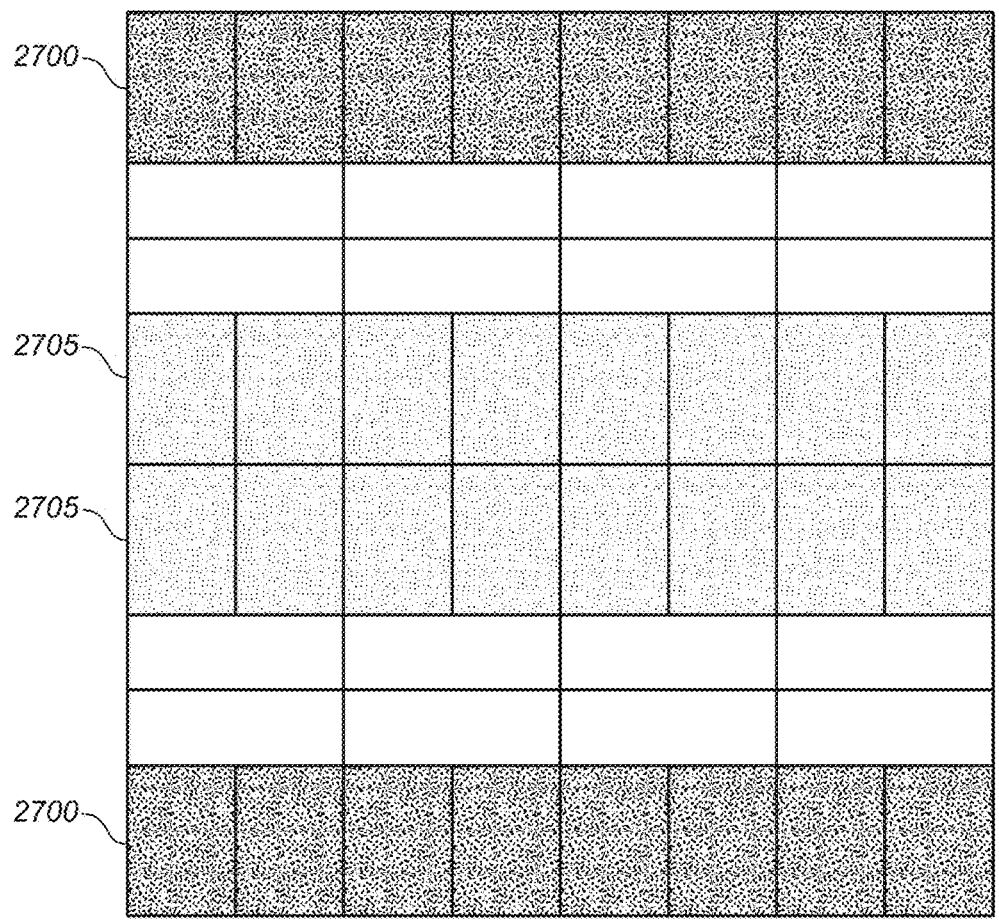
FIG. 28 illustrates an example two-dimensional array of CMOS control elements of FIG. 27, according to an embodiment.

FIG. 28 illustrates an example two-dimensional array of CMOS control elements of FIG. 27, according to an embodiment. FIG. 28 shows a layout for CMOS control elements 2700 and 2705 of FIG. 27 in a two-dimensional array using an example stripe and flip configuration. FIG. 28 illustrates a 4×4 array of CMOS control elements, comprising eight CMOS control elements 2700 and comprising eight CMOS control elements 2705. However, it should be appreciated that this example configuration can be utilized within an array of any number of CMOS control elements, and is not limited to the illustrated embodiment. In one embodiment, there is a one-to-one correspondence between control block and MEMS pixel (not shown). Thus, sixteen control blocks are illustrated in the example array, where each CMOS control element is a control block.

As illustrated, the CMOS control elements 2700 and 2705 are positioned such that PMOS semiconductor device portions and NMOS semiconductor device portions are not adjacent to each other and are separated by a predefined separation distance. For example, PMOS semiconductor device portions 2710 of CMOS control elements 2700 of the first row (e.g., top row) are positioned on an edge opposite CMOS control elements 2705 of the second row. Furthermore, the CMOS control elements 2705 of the second and third rows have reflectional symmetry such that NMOS semiconductor device portions 2720 are adjacent to each other. It should be appreciated that while the semiconductor device portions of the CMOS control elements are shown as being positioned extending horizontally across each CMOS control element, that the semiconductor devices may also be positioned vertically (e.g., rotated 90 degrees relative to the illustrated embodiment).

With reference to FIG. 14, interconnect layer 1404 is disposed between the device layer 1402 and CMOS layer 1406 and includes electrical connections for electrically coupling each devices 1410a-e to semiconductor device of the CMOS control layer 1406. It should be appreciated that the illustrated electrical connections of interconnect layer 1404 are examples, and that different types and layouts of electrical connections are contemplated. Moreover, sensing system 1400 illustrates an example similar to the layout of the two-dimensional array of CMOS control elements illustrated in FIGS. 19 and 20. However, it will be understood by one of ordinary skill in the art that the principles of FIG. 14 are applicable to other embodiments, such as the two-dimensional array of CMOS control elements illustrated in FIGS. 16, 17, and 22-24.

As illustrated, each device 1410a-e is coupled to an LV device, an HV PMOS device, and an HV NMOS device. For example, device 1410a is electrically coupled to HV PMOS device 1424 of CMOS control element 1420a via electrical connection 1431 and is electrically coupled to HV NMOS device 1426 of CMOS control element 1420b via electrical connection 1430. Similarly, device 1410b is electrically coupled to HV PMOS device 1424 of CMOS control element 1420a via electrical connection 1432 and is electrically coupled to HV NMOS device 1426 of CMOS control element 1420b via electrical connection 1433. As shown, while each device is electrically coupled to semiconductor devices of different classes, they are not necessarily electrically coupled to the CMOS control element that the overlay. Rather, there is a two-to-one relationship by which two adjacent devices share the semiconductor devices of two corresponding CMOS control elements.

In the illustrated embodiment, each CMOS control element includes LV devices. Accordingly, each device is electrically coupled to the LV devices of the CMOS control element that it overlays. For example, device 1410c is electrically coupled to LV device 1422 of CMOS control element 1420c via electrical connection 1434. In various embodiments, the LV devices are electrically isolated through a capacitor. As shown, in one embodiment, electrical connection 1434 includes capacitor 1436, such that LV device 1422 is electrically coupled to device 1410c through capacitor 1436. It should be appreciated that other ways of electrically isolating the LV devices may be used, such as connecting through another high voltage device.

In one embodiment, an electronic device includes a plurality of CMOS control elements arranged in a two-dimensional array, where each CMOS control element of the plurality of CMOS control elements includes two semiconductor devices. The plurality of CMOS control elements include a first subset of CMOS control elements (e.g., CMOS control elements 1800), each CMOS control element of the first subset of CMOS control elements including a semiconductor device of a first class and a semiconductor device of a second class, and a second subset of CMOS control elements (e.g., CMOS control elements 1805), each CMOS control element of the second subset of CMOS control elements including a semiconductor device of the first class and a semiconductor device of a third class.

In one embodiment, the semiconductor devices of the first class include low voltage devices (e.g., LV devices 1822), the semiconductor devices of the second class include high voltage PMOS devices (e.g., HV PMOS devices 1824), and the semiconductor devices of the third class include high voltage NMOS devices (e.g., HV NMOS devices 1826). In one embodiment, the semiconductor devices of the first class include low voltage devices including low voltage PMOS devices (e.g., sub-block 1830) and low voltage NMOS devices (sub-block 1836). In one embodiment, the high voltage NMOS devices are separated from the high voltage PMOS devices and the low voltage devices by at least 40 microns, and wherein the high voltage PMOS devices are separated from the low voltage devices by at least 40 microns.

The plurality of CMOS control elements are arranged in the two-dimensional array such that CMOS semiconductor devices of the first class are only adjacent to other CMOS semiconductor devices of the first class, CMOS semiconductor devices of the second class are only adjacent to other CMOS semiconductor devices of the second class, and CMOS semiconductor devices of the third class are only adjacent to other CMOS semiconductor devices of the third class.

In one embodiment, the electronic device further includes a plurality of ultrasonic transducers (e.g., devices 1410*a-e*) arranged in a two-dimensional array, where each ultrasonic transducer of the plurality of ultrasonic transducers is associated with a CMOS control element of the plurality of CMOS control elements. In one embodiment, the ultrasonic transducers are Piezoelectric Micromachined Ultrasonic Transducer (PMUT) devices (e.g., PMUT device 100).

In one embodiment, the electronic device further includes an interconnect layer (e.g., interconnect layer 1404) disposed between the plurality of CMOS control elements and the plurality of ultrasonic transducers, the interconnect layer including electrical connections for electrically coupling each ultrasonic transducer to a semiconductor device of the first class, a semiconductor device of the second class, and a semiconductor device of a third class. In one embodiment, each ultrasonic transducer is electrically coupled to a device of the first class through a capacitor.

In one embodiment, the two-dimensional array includes a plurality of rows including four rows of CMOS control elements. The first row includes CMOS control elements of the first subset of CMOS control elements, wherein the semiconductor devices of the second class are adjacent to a first edge of the first row of the CMOS control elements and the semiconductor devices of the first class are adjacent to a second edge of the first row of the CMOS control elements, wherein the first edge of the first row and the second edge of the first row are opposite edges of the CMOS control elements of the first row. The second row includes CMOS control elements of the second subset of CMOS control elements, wherein the semiconductor devices of the first class are adjacent to a first edge of the second row of the CMOS control elements and the semiconductor devices of the third class are adjacent to a second edge of the second row of the CMOS control elements, wherein the first edge of the second row and the second edge of the second row are opposite edges of the CMOS control elements of the second row, and wherein the semiconductor devices of the first class of the second row are adjacent to the semiconductor devices of the first class of the first row. The third row includes CMOS control elements of the second subset of CMOS control elements, wherein the semiconductor devices of the third class are adjacent to a first edge of the third row of the CMOS control elements and the semiconductor devices of the first class are adjacent to a second edge of the third row of the CMOS control elements, wherein the first edge of the third row and the second edge of the third row are opposite edges of the CMOS control elements of the third row, and wherein the semiconductor devices of the third class of the third row are adjacent to the semiconductor devices of the third class of the second row. And the fourth row includes CMOS control elements of the first subset of CMOS control elements, wherein the semiconductor devices of the first class are adjacent to a first edge of the fourth row of the CMOS control elements and the semiconductor devices of the second class are adjacent to a second edge of the second row of the CMOS control elements, wherein the first edge of the fourth row and the second edge of the fourth row are opposite edges of the CMOS control elements of the fourth row, and wherein the semiconductor devices of the first class of the fourth row are adjacent to the semiconductor devices of the first class of the third row.

In another embodiment, the two-dimensional array includes a plurality of rows including a first pair of rows and a second pair of rows. The first pair of rows includes CMOS control elements of the first subset of CMOS control elements, where CMOS control elements of a first row of the first pair of rows have reflectional symmetry with CMOS control elements of a second row of the first pair of rows relative to an adjacent edge of the first row of the first pair of rows and the second row of the first pair of rows. The second pair of rows includes CMOS control elements of the second subset of CMOS control elements, where CMOS control elements of a first row of the second pair of rows have reflectional symmetry with CMOS control elements of a second row of the second pair of rows relative to an adjacent edge of the first row of the second pair of rows and the second row of the second pair of rows. The first pair of rows and the second pair of rows are interlaced within the two-dimensional array.

In another embodiment, an electronic device includes a plurality of CMOS control elements arranged in a two-dimensional array, where each CMOS control element of the plurality of CMOS control elements includes three semiconductor devices. In the present embodiment, each of the three semiconductor devices is disposed in different a corner of the CMOS control element and separated by a spacing width, where the semiconductor devices include a semiconductor device of a first class, a semiconductor device of a second class, and a semiconductor device of a third class.

In one embodiment, the semiconductor devices of the first class include low voltage devices (e.g., LV devices 1522), the semiconductor devices of the second class include high voltage PMOS devices (e.g., HV PMOS devices 1524), and the semiconductor devices of the third class include high voltage NMOS devices (e.g., HV NMOS devices 1526). In one embodiment, the semiconductor devices of the first class include low voltage devices including low voltage PMOS devices and low voltage NMOS devices. In one embodiment, the high voltage NMOS devices are separated from the high voltage PMOS devices and the low voltage devices by at least 40 microns, and wherein the high voltage PMOS devices are separated from the low voltage devices by at least 40 microns.

The plurality of CMOS control elements are arranged in the two-dimensional array such that CMOS semiconductor devices of the first class are only adjacent to other CMOS semiconductor devices of the first class, CMOS semiconductor devices of the second class are only adjacent to other CMOS semiconductor devices of the second class, and CMOS semiconductor devices of the third class are only adjacent to other CMOS semiconductor devices of the third class.

In one embodiment, the electronic device further includes a plurality of ultrasonic transducers arranged in a two-dimensional array, where each ultrasonic transducer of the plurality of ultrasonic transducers is associated with a CMOS control element of the plurality of CMOS control elements. In one embodiment, the ultrasonic transducers are Piezoelectric Micromachined Ultrasonic Transducer (PMUT) devices (e.g., PMUT device 100).

In one embodiment, the electronic device further includes an interconnect layer (e.g., interconnect layer 1404) disposed between the plurality of CMOS control elements and the plurality of ultrasonic transducers, the interconnect layer including electrical connections for electrically coupling each ultrasonic transducer to a semiconductor device of the first class, a semiconductor device of the second class, and a semiconductor device of a third class. In one embodiment, each ultrasonic transducer is electrically coupled to a device of the first class through a capacitor.

In one embodiment, the plurality of CMOS control elements is arranged within the two-dimensional array such that the semiconductor devices within CMOS control elements having adjacent edges have reflectional symmetry relative to the adjacent edges of the CMOS control elements. In one embodiment, the plurality of CMOS control elements is arranged within the two-dimensional array such that the semiconductor devices within CMOS control elements having adjacent corners have 180 degree rotational symmetry relative to the adjacent corners of the CMOS control elements.

In another embodiment, an electronic device includes a plurality of CMOS control elements arranged in a two-dimensional array, each CMOS control element of the plurality of CMOS control elements including a semiconductor device. The plurality of CMOS control elements includes a first subset of CMOS control elements including a semiconductor device of a first class, a second subset of CMOS control elements including a semiconductor device of a second class, and a third subset of CMOS control elements including a semiconductor device of a third class.

In one embodiment, the semiconductor devices of the first class include low voltage devices (e.g., LV devices 2022), the semiconductor devices of the second class include high voltage PMOS devices (e.g., HV PMOS devices 2024), and the semiconductor devices of the third class include high voltage NMOS devices (e.g., HV NMOS devices 2026). In one embodiment, the semiconductor devices of the first class include low voltage devices including low voltage PMOS devices and low voltage NMOS devices. In one embodiment, the high voltage NMOS devices are separated from the high voltage PMOS devices and the low voltage devices by at least 40 microns, and wherein the high voltage PMOS devices are separated from the low voltage devices by at least 40 microns.

The plurality of CMOS control elements are arranged in the two-dimensional array such that CMOS semiconductor devices of the first class are only adjacent to other CMOS semiconductor devices of the first class, CMOS semiconductor devices of the second class are only adjacent to other CMOS semiconductor devices of the second class, and CMOS semiconductor devices of the third class are only adjacent to other CMOS semiconductor devices of the third class.

In one embodiment, the electronic device further includes a plurality of ultrasonic transducers arranged in a two-dimensional array, where each ultrasonic transducer of the plurality of ultrasonic transducers is associated with a CMOS control element of the plurality of CMOS control elements. In one embodiment, the ultrasonic transducers are Piezoelectric Micromachined Ultrasonic Transducer (PMUT) devices (e.g., PMUT device 100).

In one embodiment, the electronic device further includes an interconnect layer (e.g., interconnect layer 1404) disposed between the plurality of CMOS control elements and the plurality of ultrasonic transducers, the interconnect layer including electrical connections for electrically coupling each ultrasonic transducer to a semiconductor device of the first class, a semiconductor device of the second class, and a semiconductor device of a third class. In one embodiment, each ultrasonic transducer is electrically coupled to a device of the first class through a capacitor.

In one embodiment, the two-dimensional array a plurality of rows of CMOS control elements. A first row includes CMOS control elements of the first subset of CMOS control elements (e.g., control elements 2005), wherein the semiconductor devices of the first class are disposed within and span a width of the CMOS control elements of the first subset of CMOS control elements, such that the semiconductor devices of the first class of adjacent CMOS control elements of the first row are adjacent. A second row includes CMOS control elements of the second subset of CMOS control elements (e.g., control elements 2000), wherein the semiconductor devices of the second class are disposed within and span a width of the CMOS control elements of the second subset of CMOS control elements, such that the semiconductor devices of the second class of adjacent CMOS control elements of the second row are adjacent. A third row includes CMOS control elements of the third subset of CMOS control elements (e.g., control elements 2010), wherein the semiconductor devices of the third class are disposed within and span a width of the CMOS control elements of the third subset of CMOS control elements, such that the semiconductor devices of the third class of adjacent CMOS control elements of the third row are adjacent.

In one embodiment, the plurality of rows is arranged in an ABACAB pattern. For example, the pattern includes a first row (A) of the plurality of first rows, a second row (B) of the plurality of second rows, a first row (A) of the plurality of first rows, a third row (C) of the plurality of third rows, and a first row (A) of the plurality of first rows. In another embodiment, the plurality of rows is arranged in an ABCABC pattern. For example, the pattern includes a first row (A) of the plurality of first rows, a second row (B) of the plurality of second rows, a third row (C) of the plurality of third rows, and a first row (A) of the plurality of first rows. It should be appreciated that other patterns for arranging the rows are contemplated.

In one embodiment, an electronic device includes a plurality of CMOS control elements arranged in a two-dimensional array, where each CMOS control element of the plurality of CMOS control elements includes semiconductor devices. The plurality of CMOS control elements each includes a PMOS semiconductor device portion comprising a high voltage PMOS device and a low voltage PMOS device and an NMOS semiconductor device portion comprising a high voltage NMOS device and a low voltage NMOS device. The plurality of CMOS control elements are arranged in the two-dimensional array such that the PMOS semiconductor device portion of a CMOS control element of the plurality of CMOS control elements is only adjacent to other PMOS semiconductor device portions of adjacent CMOS control elements of the plurality of CMOS control elements, and such that the NMOS semiconductor device portion of a CMOS control element of the plurality of CMOS control elements is only adjacent to other NMOS semiconductor device portions of adjacent CMOS control elements of the plurality of CMOS control elements. In one embodiment, the PMOS semiconductor device portion and the NMOS semiconductor device portion are separated by at least 40 microns.

In one embodiment, the electronic device further includes a plurality of ultrasonic transducers (e.g., devices 1410a-e) arranged in a two-dimensional array, where each ultrasonic transducer of the plurality of ultrasonic transducers is associated with a CMOS control element of the plurality of CMOS control elements. In one embodiment, the ultrasonic transducers are Piezoelectric Micromachined Ultrasonic Transducer (PMUT) devices (e.g., PMUT device 100).

In one embodiment, the electronic device further includes an interconnect layer (e.g., interconnect layer 1404) disposed between the plurality of CMOS control elements and the plurality of ultrasonic transducers, the interconnect layer including electrical connections for electrically each ultrasonic transducer to a semiconductor device of the PMOS semiconductor device portion and to a semiconductor device of the NMOS semiconductor device portion. In one embodiment, the electrical connections are for interconnecting each ultrasonic transducer to a high voltage PMOS device and a low voltage PMOS device of the PMOS semiconductor device portion and to a high voltage NMOS device and a low voltage NMOS device of the NMOS semiconductor device portion.

In one embodiment, the two-dimensional array comprises a plurality of rows of CMOS control elements, wherein adjacent rows have an alternating orientation of the CMOS control elements, such that CMOS control elements of a first row have reflectional symmetry with CMOS control elements of a second row of relative to an adjacent edge of the first row and the second row. In one embodiment, CMOS control elements have reflectional symmetry with adjacent CMOS control elements relative to adjacent edges.

In one embodiment, an electronic device includes a plurality of CMOS control elements arranged in a two-dimensional array, where each CMOS control element of the plurality of CMOS control elements includes a semiconductor device. The plurality of CMOS control elements each includes a first subset of CMOS control elements including a PMOS semiconductor device portion, the PMOS semiconductor device portion comprising a high voltage PMOS device and a low voltage PMOS device, and a second subset of CMOS control elements comprising an NMOS semiconductor device portion, the NMOS semiconductor device portion including a high voltage NMOS device and a low voltage NMOS device. The plurality of CMOS control elements are arranged in the two-dimensional array such that the PMOS semiconductor device portion of a CMOS control element of the first subset of CMOS control elements is only adjacent to other PMOS semiconductor device portions of adjacent CMOS control elements of the first subset of CMOS control elements, and such that the NMOS semiconductor device portion of a CMOS control element of the second subset of CMOS control elements is only adjacent to other NMOS semiconductor device portions of adjacent CMOS control elements of the second subset of CMOS control elements. In one embodiment, the PMOS semiconductor device portion and the NMOS semiconductor device portion of adjacent CMOS control elements are separated by at least 40 microns.

In one embodiment, the electronic device further includes a plurality of ultrasonic transducers (e.g., devices 1410a-e) arranged in a two-dimensional array, where each ultrasonic transducer of the plurality of ultrasonic transducers is associated with a CMOS control element of the plurality of CMOS control elements. In one embodiment, the ultrasonic transducers are Piezoelectric Micromachined Ultrasonic Transducer (PMUT) devices (e.g., PMUT device 100).

In one embodiment, the electronic device further includes an interconnect layer (e.g., interconnect layer 1404) disposed between the plurality of CMOS control elements and the plurality of ultrasonic transducers, the interconnect layer including electrical connections for electrically each ultrasonic transducer to a semiconductor device of the PMOS semiconductor device portion and to a semiconductor device of the NMOS semiconductor device portion. In one embodiment, the electrical connections are for interconnecting each ultrasonic transducer to a high voltage PMOS device and a low voltage PMOS device of the PMOS semiconductor device portion and to a high voltage NMOS device and a low voltage NMOS device of the NMOS semiconductor device portion.

In one embodiment, the two-dimensional array includes a plurality of rows, in which a first row includes CMOS control elements of the first subset of CMOS control elements, wherein the semiconductor devices of the PMOS semiconductor device portion are adjacent to a first edge of the first row of the CMOS control elements, wherein the first edge of the first row and a second edge of the first row are opposite edges of the CMOS control elements of the first row. A second row includes CMOS control elements of the second subset of CMOS control elements, wherein the semiconductor devices of the NMOS semiconductor device portion are adjacent to a first edge of the second row of the CMOS control elements, wherein the first edge of the second row and a second edge of the second row are opposite edges of the CMOS control elements of the second row, and wherein the second edge of the second row is adjacent to the second edge of the first row. A third row includes CMOS control elements of the second subset of CMOS control elements, wherein the semiconductor devices of the NMOS semiconductor device portion are adjacent to a first edge of the third row of the CMOS control elements, wherein the first edge of the third row and a second edge of the third row are opposite edges of the CMOS control elements of the third row, and wherein the first edge of the third row is adjacent to the first edge of the second row. A fourth row includes CMOS control elements of the first subset of CMOS control elements, wherein the semiconductor devices of the PMOS semiconductor device portion are adjacent to a first edge of the fourth row of the CMOS control elements, wherein the first edge of the fourth row and a second edge of the fourth row are opposite edges of the CMOS control elements of the fourth row, and wherein the second edge of the fourth row is adjacent to the second edge of the third row. In one embodiment, the plurality of rows further includes a fifth row includes CMOS control elements of the first subset of CMOS control elements, wherein the semiconductor devices of the PMOS semiconductor device portion are adjacent to a first edge of the fifth row of the CMOS control elements, wherein the first edge of the fifth row and a second edge of the fifth row are opposite edges of the CMOS control elements of the fifth row, and wherein the first edge of the fifth row is adjacent to the first edge of the fourth row.

In one embodiment, the two-dimensional array includes a plurality of rows, in which a first pair of rows includes CMOS control elements of the first subset of CMOS control elements, wherein CMOS control elements of a first row of the first pair of rows have reflectional symmetry with CMOS control elements of a second row of the first pair of rows relative to an adjacent edge of the first row of the first pair of rows and the second row of the first pair of rows, such that the PMOS semiconductor device portion of the first row of the first pair of rows is adjacent to the PMOS semiconductor device portion of the second row of the first pair of rows. A second pair of rows includes CMOS control elements of the second subset of CMOS control elements, wherein CMOS control elements of a first row of the second pair of rows have reflectional symmetry with CMOS control elements of a second row of the second pair of rows relative to an adjacent edge of the first row of the second pair of rows and the second row of the second pair of rows, such that the NMOS semiconductor device portion of the first row of the second pair of rows is adjacent to the NMOS semiconductor device portion of the second row of the second pair of rows. In various embodiments, the first pair of rows and the second pair of rows are interlaced within the two-dimensional array.

What has been described above includes examples of the subject disclosure. It is, of course, not possible to describe every conceivable combination of components or methodologies for purposes of describing the subject matter, but it is to be appreciated that many further combinations and permutations of the subject disclosure are possible. Accordingly, the claimed subject matter is intended to embrace all such alterations, modifications, and variations that fall within the spirit and scope of the appended claims.

In particular and in regard to the various functions performed by the above described components, devices, circuits, systems and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the claimed subject matter.

The aforementioned systems and components have been described with respect to interaction between several components. It can be appreciated that such systems and components can include those components or specified sub-components, some of the specified components or sub-components, and/or additional components, and according to various permutations and combinations of the foregoing. Sub-components can also be implemented as components communicatively coupled to other components rather than included within parent components (hierarchical). Additionally, it should be noted that one or more components may be combined into a single component providing aggregate functionality or divided into several separate sub-components. Any components described herein may also interact with one or more other components not specifically described herein.

In addition, while a particular feature of the subject innovation may have been disclosed with respect to only one of several implementations, such feature may be combined with one or more other features of the other implementations as may be desired and advantageous for any given or particular application. Furthermore, to the extent that the terms "includes," "including," "has," "contains," variants thereof, and other similar words are used in either the detailed description or the claims, these terms are intended to be inclusive in a manner similar to the term "comprising" as an open transition word without precluding any additional or other elements.

Thus, the embodiments and examples set forth herein were presented in order to best explain various selected embodiments of the present invention and its particular application and to thereby enable those skilled in the art to make and use embodiments of the invention. However, those skilled in the art will recognize that the foregoing description and examples have been presented for the purposes of illustration and example only. The description as set forth is not intended to be exhaustive or to limit the embodiments of the invention to the precise form disclosed.

What is claimed is:

1. An electronic device comprising:
   a plurality of CMOS control elements arranged in a two-dimensional array, each CMOS control element of the plurality of CMOS control elements comprising two semiconductor devices, the plurality of CMOS control elements comprising:
      a first subset of CMOS control elements, each CMOS control element of the first subset of CMOS control elements comprising a low voltage semiconductor device and a high voltage PMOS semiconductor device; and
      a second subset of CMOS control elements, each CMOS control element of the second subset of CMOS control elements comprising a low voltage semiconductor device and a high voltage NMOS semiconductor device; and
   a plurality of MEMS devices arranged in a two-dimensional array, each MEMS device of the plurality of MEMS devices associated with a CMOS control element of the plurality of CMOS control elements;
   wherein the plurality of CMOS control elements are arranged in the two-dimensional array such that low voltage semiconductor devices are only adjacent to low voltage semiconductor devices of the plurality of CMOS control elements, high voltage PMOS semiconductor devices are only adjacent to other high voltage PMOS semiconductor devices, and high voltage NMOS semiconductor devices are only adjacent to other high voltage NMOS semiconductor devices.

2. The electronic device of claim 1, wherein the plurality of MEMS devices comprise a plurality of ultrasonic transducers.

3. The electronic device of claim 2, wherein the ultrasonic transducers are Piezoelectric Micromachined Ultrasonic Transducer (PMUT) devices.

4. The electronic device of claim 2 further comprising:
   an interconnect layer disposed between the plurality of CMOS control elements and the plurality of ultrasonic transducers, the interconnect layer comprising electrical connections for electrically coupling each ultrasonic transducer to a low voltage semiconductor device, a high voltage PMOS semiconductor device, and a high voltage NMOS semiconductor device.

5. The electronic device of claim 4, wherein each ultrasonic transducer is electrically coupled to a low voltage semiconductor device through a capacitor.

6. The electronic device of claim 1, wherein the low voltage semiconductor device comprises a low voltage NMOS device and a low voltage PMOS device.

7. The electronic device of claim 1, wherein the two-dimensional array comprises a plurality of rows comprising:
a first row comprising CMOS control elements of the first subset of CMOS control elements, wherein the high voltage PMOS semiconductor devices are adjacent to a first edge of the first row of the CMOS control elements and the low voltage semiconductor devices are adjacent to a second edge of the first row of the CMOS control elements, wherein the first edge of the first row and the second edge of the first row are opposite edges of the CMOS control elements of the first row;
a second row comprising CMOS control elements of the second subset of CMOS control elements, wherein the low voltage semiconductor devices are adjacent to a first edge of the second row of the CMOS control elements and the high voltage NMOS semiconductor devices are adjacent to a second edge of the second row of the CMOS control elements, wherein the first edge of the second row and the second edge of the second row are opposite edges of the CMOS control elements of the second row, and wherein the low voltage semiconductor devices of the second row are adjacent to the low voltage semiconductor devices of the first row;
a third row comprising CMOS control elements of the second subset of CMOS control elements, wherein the high voltage NMOS semiconductor devices are adjacent to a first edge of the third row of the CMOS control elements and the low voltage semiconductor devices are adjacent to a second edge of the third row of the CMOS control elements, wherein the first edge of the third row and the second edge of the third row are opposite edges of the CMOS control elements of the third row, and wherein the high voltage NMOS semiconductor devices of the third row are adjacent to the high voltage NMOS semiconductor devices of the second row; and
a fourth row comprising CMOS control elements of the first subset of CMOS control elements, wherein the low voltage semiconductor devices are adjacent to a first edge of the fourth row of the CMOS control elements and the high voltage PMOS semiconductor devices are adjacent to a second edge of the second row of the CMOS control elements, wherein the first edge of the fourth row and the second edge of the fourth row are opposite edges of the CMOS control elements of the fourth row, and wherein the low voltage semiconductor devices of the fourth row are adjacent to the low voltage semiconductor devices of the third row.

8. The electronic device of claim 1, wherein the two-dimensional array comprises a plurality of rows comprising:
a first pair of rows comprising CMOS control elements of the first subset of CMOS control elements, wherein CMOS control elements of a first row of the first pair of rows have reflectional symmetry with CMOS control elements of a second row of the first pair of rows relative to an adjacent edge of the first row of the first pair of rows and the second row of the first pair of rows; and
a second pair of rows comprising CMOS control elements of the second subset of CMOS control elements, wherein CMOS control elements of a first row of the second pair of rows have reflectional symmetry with CMOS control elements of a second row of the second pair of rows relative to an adjacent edge of the first row of the second pair of rows and the second row of the second pair of rows;
wherein the first pair of rows and the second pair of rows are interlaced within the two-dimensional array.

9. An electronic device comprising:
a plurality of CMOS control elements arranged in a two-dimensional array, each CMOS control element of the plurality of CMOS control elements comprising three semiconductor devices, wherein each of the three semiconductor devices is disposed in different a corner of the CMOS control element and separated by a spacing width, the semiconductor devices comprising:
a low voltage semiconductor device;
a high voltage PMOS semiconductor device; and
a high voltage NMOS semiconductor device; and
a plurality of MEMS devices arranged in a two-dimensional array, each MEMS device of the plurality of MEMS devices associated with a CMOS control element of the plurality of CMOS control elements;
wherein the plurality of CMOS control elements are arranged in the two-dimensional array such that low voltage semiconductor devices are only adjacent to low voltage semiconductor devices, high voltage PMOS semiconductor devices are only adjacent to other high voltage PMOS semiconductor devices, and high voltage NMOS semiconductor devices are only adjacent to other high voltage NMOS semiconductor devices.

10. The electronic device of claim 9, wherein the plurality of MEMS devices comprise a plurality of ultrasonic transducers.

11. The electronic device of claim 10, wherein the ultrasonic transducers are Piezoelectric Micromachined Ultrasonic Transducer (PMUT) devices.

12. The electronic device of claim 10 further comprising:
an interconnect layer disposed between the plurality of CMOS control elements and the plurality of ultrasonic transducers, the interconnect layer comprising electrical connections for electrically coupling each ultrasonic transducer to a low voltage semiconductor device, a high voltage PMOS semiconductor device, and a high voltage NMOS semiconductor device.

13. The electronic device of claim 12, wherein each ultrasonic transducer is electrically coupled to a low voltage semiconductor device through a capacitor.

14. The electronic device of claim 9, wherein the low voltage semiconductor device comprises a low voltage NMOS device and a low voltage PMOS device.

15. The electronic device of claim 9, wherein the plurality of CMOS control elements are arranged within the two-dimensional array such that the semiconductor devices within CMOS control elements having adjacent edges have reflectional symmetry relative to the adjacent edges of the CMOS control elements.

16. The electronic device of claim 9, wherein the plurality of CMOS control elements are arranged within the two-dimensional array such that the semiconductor devices within CMOS control elements having adjacent corners have 180 degree rotational symmetry relative to the adjacent corners of the CMOS control elements.

17. An electronic device comprising:
a plurality of CMOS control elements arranged in a two-dimensional array, each CMOS control element of the plurality of CMOS control elements comprising a semiconductor device, the plurality of CMOS control elements comprising:
  a first subset of CMOS control elements comprising a low voltage semiconductor device;
  a second subset of CMOS control elements comprising a high voltage PMOS semiconductor device; and
  a third subset of CMOS control elements comprising a high voltage NMOS semiconductor device; and
a plurality of MEMS devices arranged in a two-dimensional array, each MEMS device of the plurality of MEMS devices associated with a CMOS control element of the plurality of CMOS control elements;
wherein the plurality of CMOS control elements are arranged in the two-dimensional array such that low voltage semiconductor devices are only adjacent to low voltage semiconductor devices, high voltage PMOS semiconductor devices are only adjacent to other high voltage PMOS semiconductor devices, and high voltage NMOS semiconductor devices are only adjacent to other high voltage NMOS semiconductor devices.

18. The electronic device of claim 17, wherein the plurality of MEMS devices comprise a plurality of ultrasonic transducers.

19. The electronic device of claim 18, wherein the ultrasonic transducers are Piezoelectric Micromachined Ultrasonic Transducer (PMUT) devices, wherein the PMUT devices comprise center pinned membranes.

20. The electronic device of claim 18 further comprising:
an interconnect layer disposed between the plurality of CMOS control elements and the plurality of ultrasonic transducers, the interconnect layer comprising electrical connections for electrically coupling each ultrasonic transducer to a low voltage semiconductor device, a high voltage PMOS semiconductor device, and a high voltage NMOS semiconductor device.

21. The electronic device of claim 20, wherein each ultrasonic transducer is electrically coupled to a low voltage semiconductor device through a capacitor.

22. The electronic device of claim 17, wherein the low voltage semiconductor device comprises a low voltage NMOS device and a low voltage PMOS device.

23. The electronic device of claim 17, wherein the two-dimensional array comprises a plurality of rows comprising:
  a first row comprising CMOS control elements of the first subset of CMOS control elements, wherein the low voltage semiconductor devices are disposed within and span a width of the CMOS control elements of the first subset of CMOS control elements, such that the low voltage semiconductor devices of adjacent CMOS control elements of the first row are adjacent;
  a second row comprising CMOS control elements of the second subset of CMOS control elements, wherein the high voltage PMOS semiconductor devices are disposed within and span a width of the CMOS control elements of the second subset of CMOS control elements, such that the high voltage PMOS semiconductor devices of adjacent CMOS control elements of the second row are adjacent; and
  a third row comprising CMOS control elements of the third subset of CMOS control elements, wherein the high voltage NMOS semiconductor devices are disposed within and span a width of the CMOS control elements of the third subset of CMOS control elements, such that the high voltage NMOS semiconductor devices of adjacent CMOS control elements of the third row are adjacent.

24. The electronic device of claim 23, wherein the plurality of rows are arranged in a pattern comprising a plurality of first rows, a plurality of second rows, and a plurality of third rows, the pattern comprising:
  a first row of the plurality of first rows;
  a second row of the plurality of second rows;
  a first row of the plurality of first rows;
  a third row of the plurality of third rows; and
  a first row of the plurality of first rows.

25. The electronic device of claim 23, wherein the plurality of rows are arranged in a pattern comprising a plurality of first rows, a plurality of second rows, and a plurality of third rows, the pattern comprising:
  a first row of the plurality of first rows;
  a second row of the plurality of second rows;
  a third row of the plurality of third rows; and
  a first row of the plurality of first rows.

* * * * *